(12) United States Patent
Narumi et al.

(10) Patent No.: US 10,190,872 B2
(45) Date of Patent: Jan. 29, 2019

(54) PHOTODETECTION DEVICE INCLUDING INTERFERENCE ELEMENT

(71) Applicant: Panasonic Intellectual Property Management Co., Ltd., Osaka (JP)

(72) Inventors: Kenji Narumi, Osaka (JP); Teruhiro Shiono, Osaka (JP); Seiji Nishiwaki, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/107,872

(22) Filed: Aug. 21, 2018

(65) Prior Publication Data

US 2018/0356212 A1 Dec. 13, 2018

Related U.S. Application Data

(62) Division of application No. 15/447,054, filed on Mar. 1, 2017, now Pat. No. 10,082,389.

(30) Foreign Application Priority Data

Mar. 14, 2016 (JP) .................................. 2016-050096
Nov. 29, 2016 (JP) .................................. 2016-231011

(51) Int. Cl.
*G01B 11/24* (2006.01)
*G01B 9/02* (2006.01)
*G01J 3/453* (2006.01)

(52) U.S. Cl.
CPC ...... *G01B 11/2441* (2013.01); *G01B 9/02051* (2013.01); *G01J 3/4532* (2013.01)

(58) Field of Classification Search
CPC ...... G01J 3/45; G01J 2003/451; G01J 3/4532; G01J 3/4531; G01B 9/0201; G01B 11/2441

See application file for complete search history.

(56) References Cited

U.S. PATENT DOCUMENTS 9,766,123 B2 * 9/2017 Brueck .................... G01J 1/06
2002/0126279 A1 9/2002 Kung et al.
(Continued)

FOREIGN PATENT DOCUMENTS

EP 2450673 A2 * 5/2012 ......... G01B 11/2441
JP H10-221032 A 8/1998
(Continued)

OTHER PUBLICATIONS

Yeou-Yen Cheng et al., "Two-wavelength phase shifting interferometry", Applied Optics, vol. 23, No. 24, pp. 4539-4543, Dec. 15, 1984.
(Continued)

*Primary Examiner* — Michael P LaPage
(74) *Attorney, Agent, or Firm* — McDermott Will & Emery LLP

(57) ABSTRACT

A photodetection device including an image sensor that includes first pixels and second pixels; an interference element that includes incident regions; and illumination that emits light in a first wavelength band and a second wavelength band. The interference element causes first interference of light in the first wavelength band incident on two incident regions, and guides resultant light of the first interference to any of the first pixels and guides another part of the light in the first wavelength band to any of the second pixels, and causes second interference of part of the light in the second wavelength band incident on the two incident regions, and guides resultant light of the second interference to any of the first pixels and guides another part of the light in the second wavelength band incident on the two incident regions to any of the second pixels.

3 Claims, 35 Drawing Sheets

(56) References Cited

U.S. PATENT DOCUMENTS

| | | | |
|---|---|---|---|
| 2006/0228073 A1* | 10/2006 | Mukawa | G02B 6/0026 |
| | | | 385/31 |
| 2011/0205339 A1 | 8/2011 | Pavani et al. | |
| 2011/0235051 A1* | 9/2011 | Huber | G01B 11/14 |
| | | | 356/499 |
| 2012/0112050 A1 | 5/2012 | Joerger et al. | |
| 2012/0228475 A1 | 9/2012 | Pang et al. | |
| 2012/0267515 A1 | 10/2012 | Wu et al. | |
| 2014/0362374 A1 | 12/2014 | Santori et al. | |
| 2017/0052384 A1 | 2/2017 | Santori et al. | |
| 2017/0276940 A1* | 9/2017 | Popovich | G02B 27/01 |
| 2018/0024001 A1 | 1/2018 | Brueck et al. | |

FOREIGN PATENT DOCUMENTS

| | | |
|---|---|---|
| JP | 2016/008956 A | 1/2016 |
| WO | 2011/064403 A1 | 6/2011 |
| WO | 2014/043801 A1 | 3/2014 |

OTHER PUBLICATIONS

Notice of Allowance issued in related U.S. Application No. 15/447,054 dated May 22, 2018.

* cited by examiner

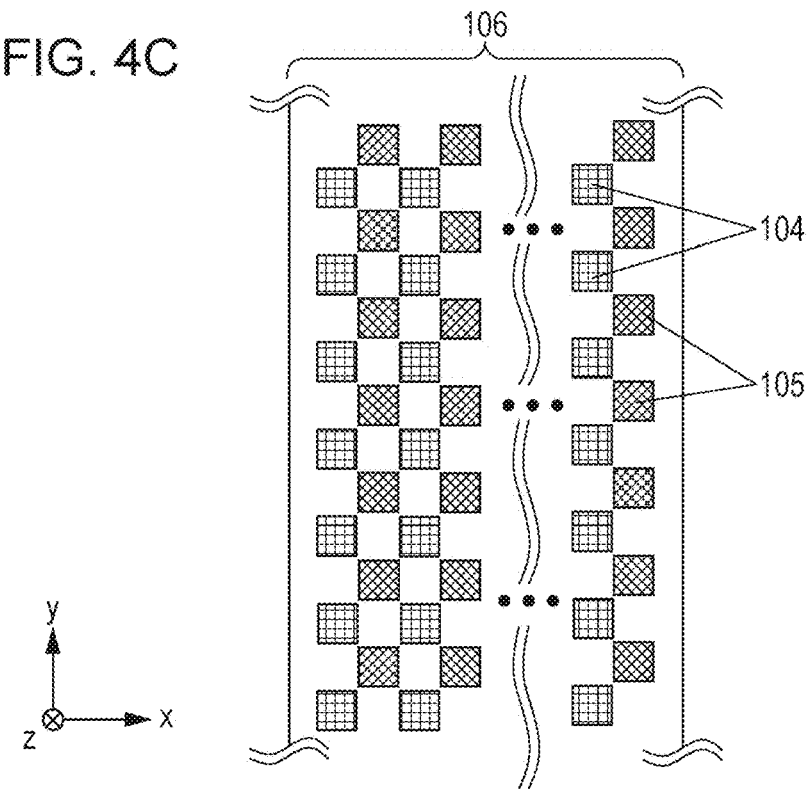
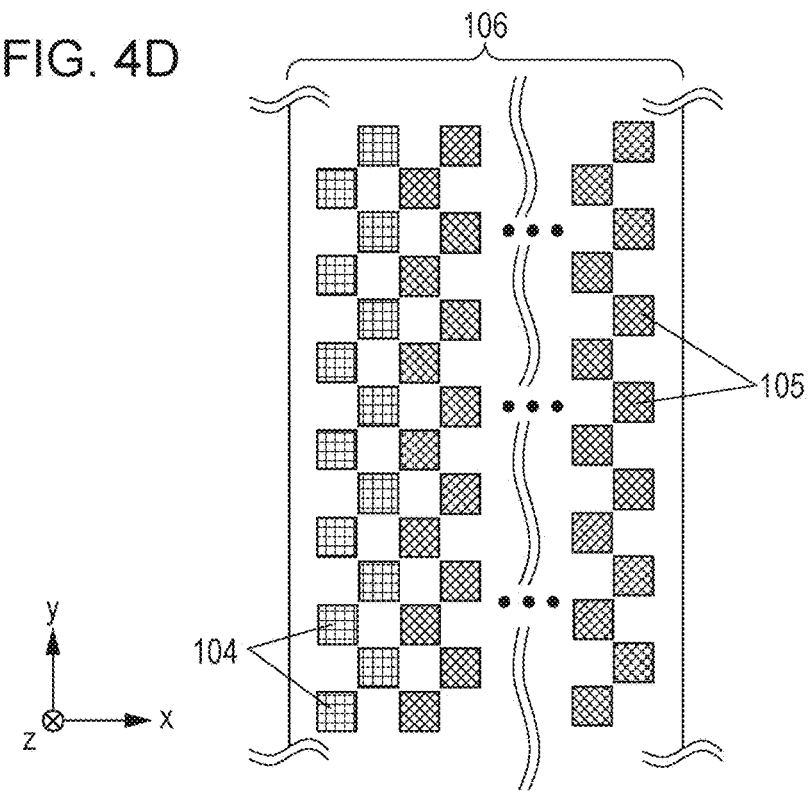

PHOTODETECTION DEVICE INCLUDING INTERFERENCE ELEMENT

CROSS-REFERENCE OF RELATED APPLICATIONS

This application is the Divisional of U.S. application Ser. No. 15/447,054 filed on Mar. 1, 2017, which claims the benefit of Japanese Application Nos. 2016-231011 filed on Nov. 29, 2016 and 2016-050096 filed on Mar. 14, 2016, the entire contents of each are hereby incorporated by reference.

BACKGROUND

1. Technical Field

The present disclosure relates to a photodetection device including an interference element.

2. Description of the Related Art

A device that measures the shape or a distance of an object with high accuracy and in a noncontact manner by utilizing an interference phenomenon of light is in practical use. Generally in such a device, the light that has reflected off or passed through an object, which is referred to as an object light, and the light that has reflected off a reference surface, which is referred to as a reference light, are caused to interfere with each other. The generated interference light is imaged and observed. In a state where the degree of the flatness of the reference surface is sufficiently ensured, interference fringes of the interference light occur according to the optical path length of the object light. Difference in optical path length that corresponds to the wavelength of the light causes interference fringes of one period. Thus, the three-dimensional shape of a measured surface of the object can be determined from the pattern of the interference fringes.

The difference in optical path length equal to or larger than the wavelength of the light causes a repeat of interference fringes. When the measured surface of the object is smooth, the difference in the optical path length beyond the wavelength of the light can be estimated by counting these interference fringes.

When the measured surface of the object includes a step beyond the wavelength, the interference fringes lack in the step portion and accordingly, the difference in the optical path length is unable to be determined accurately. As a method of measuring the shape of an object in such a case, two-wavelength interferometry is known. The two-wavelength interferometry is described in for example, Japanese Unexamined Patent Application Publication No. 10-221032 and Yeou-Yen Cheng and James C. Wyant: "Two-wavelength phase shifting interferometry", Applied Optics, vol. 23, No. 24, pp. 4539 to 4543.

The two-wavelength interferometry uses lights with two wavelengths to perform interference measurement. Images of the interference fringes according to the lights with the respective wavelengths are independently or simultaneously picked up and on the basis of information on the interference fringes of both of the wavelengths, the shape of the measured surface of the object is determined. When the two wavelengths are referred to as $\lambda_1$ and $\lambda_2$, it is known that an effective measurement wavelength $\lambda_{eff}$ is obtained by the two-wavelength interferometry as expressed below.

$$\lambda_{eff} = \frac{\lambda_1 \lambda_2}{|\lambda_1 - \lambda_2|}$$

When for example, $\lambda_2=1.1\times\lambda_1$, $\lambda_{eff}=11\times\lambda_1$ and a step that is larger can be accurately estimated.

SUMMARY

One non-limiting and exemplary embodiment provides a photodetection device that has an optical part smaller in size and that is less susceptible to the influence of an ambient environment.

In one general aspect, the techniques disclosed here feature a photodetection device including an image sensor that includes first pixels and second pixels; an interference element that includes incident regions; and illumination that emits light in a first wavelength band and light in a second wavelength band different from the first wavelength band. The interference element causes first interference of part of the light in the first wavelength band incident on two incident regions that are included in the incident regions and that are adjacent to each other, and guides resultant light of the first interference to any of the first pixels and guides another part of the light in the first wavelength band incident on the two incident regions to any of the second pixels, and causes second interference of part of the light in the second wavelength band incident on the two incident regions, and guides resultant light of the second interference to any of the first pixels and guides another part of the light in the second wavelength band incident on the two incident regions to any of the second pixels.

The present disclosure can achieve a photodetection device that has an optical part smaller in size and that is less susceptible to the influence of an ambient environment.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 4C illustrates an arrangement example of the incident regions according to the first embodiment of the present disclosure;

FIG. 4D illustrates an arrangement example of the incident regions according to the first embodiment of the present disclosure;

DETAILED DESCRIPTION

Figure 1:
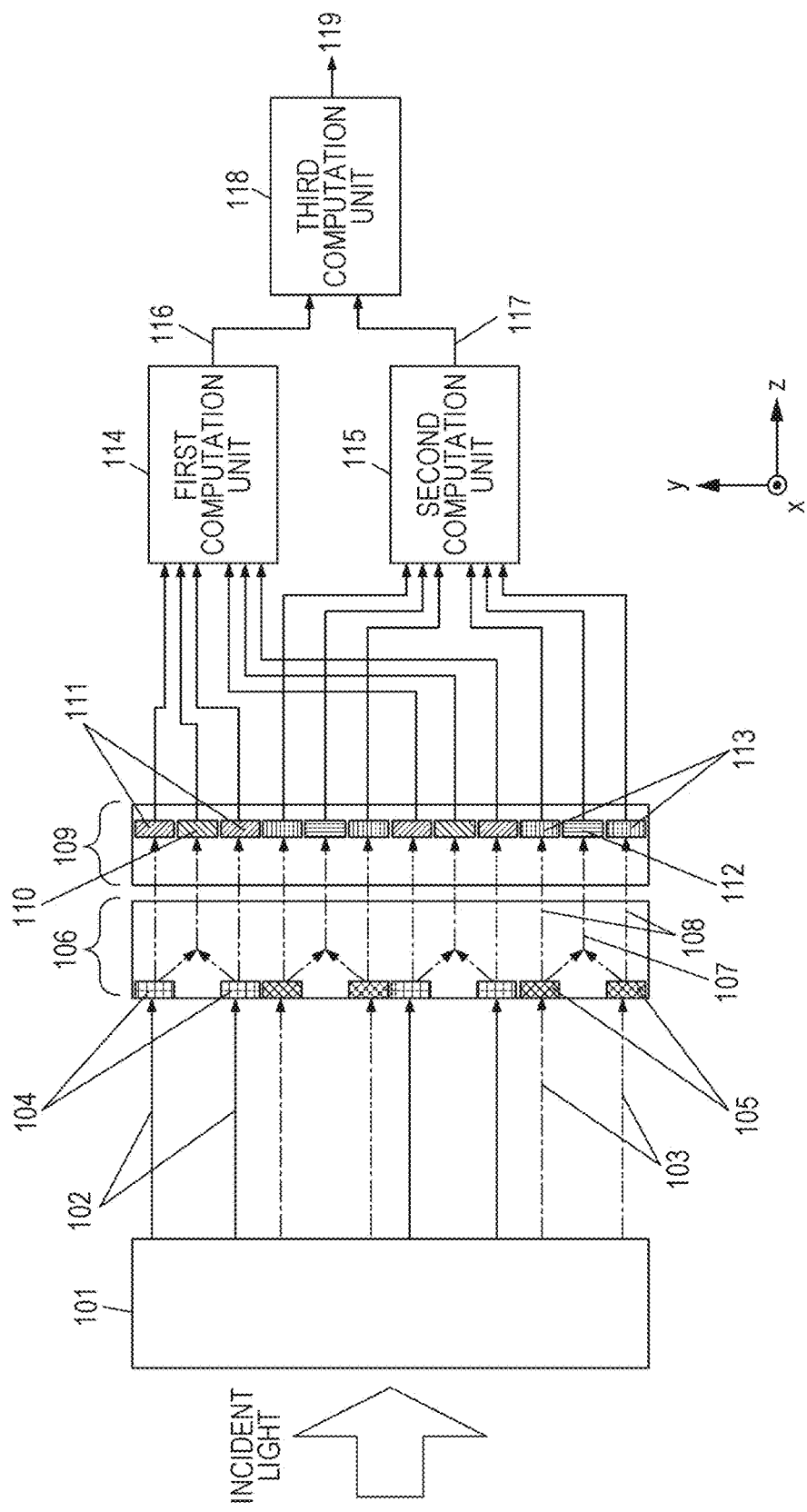
FIG. 1 is a schematic diagram of a configuration of a photodetection device according to a first embodiment of the present disclosure.

<Underlying Knowledge Forming Basis of the Present Disclosure>

The present disclosure relates to a photodetection device that obtains information on the shape or distance of an object as an image by utilizing an interference phenomenon of light. In particular, the present disclosure relates to a photodetection device that can measure variations in step beyond a wavelength or in shape as an image with high accuracy. The present inventors have reviewed the conventional photodetection devices that are disclosed in Japanese Unexamined Patent Application Publication No. 10-221032 and Yeou-Yen Cheng and James C. Wyant: "Two-wavelength phase shifting interferometry", Applied Optics, vol. 23, No. 24, pp. 4539 to 4543 in detail. The photodetection devices disclosed in the above-mentioned related art require a one-way mirror for causing interference light and occasionally need a camera tube or an image sensor for each wavelength. Thus, there may be a limitation in downsizing an optical system in a photodetection device. The presence of an optical path in predetermined space may cause susceptibility to change in or influence of an ambient environment, such as convection of air or vibrations of the optical system.

In view of the above-described issues, the present inventors have conceived a new photodetection device that has an optical part smaller in size and that is less susceptible to the influence of an ambient environment.

A photodetection device according to an aspect of the present disclosure includes: an image sensor that includes first pixels, second pixels, third pixels, and fourth pixels; an interference element that includes first incident regions and second incident regions; and an optical system that causes light in a first wavelength band to be incident on the first incident regions and causes light in a second wavelength band different from the first wavelength band to be incident on the second incident regions. The interference element causes first interference of part of the light in the first wavelength band incident on two first incident regions that are included in the first incident regions and that are adjacent to each other, and guides resultant light of the first interference to any of the first pixels and guides another part of the light in the first wavelength band incident on the two first incident regions to any of the second pixels. The interference element also causes second interference of part of the light in the second wavelength band incident on two second incident regions that are included in the second incident regions and that are adjacent to each other, and guides resultant light of the second interference to any of the third pixels and guides another part of the light in the second wavelength band incident on the two second incident regions to any of the fourth pixels.

The "light in the first wavelength band" herein indicates light having any wavelength included in the first wavelength band. The "light in the second wavelength band" indicates light having any wavelength included in the second wavelength band. Thus, the light in the first wavelength band and the light in the second wavelength band may each be light with a single wavelength or be light having a predetermined bandwidth.

The photodetection device may further include computation circuitry that determines first phase difference information using optical intensity information detected at the first pixels and optical intensity information detected at the second pixels, and determines second phase difference information using optical intensity information detected at the third pixels and optical intensity information detected at the fourth pixels.

The computation circuitry may determine phase difference information at an equivalent wavelength of a first wavelength included in the first wavelength band and a second wavelength included in the second wavelength band using the first phase difference information and the second phase difference information.

The interference element may include optical coupling layers, and the optical coupling layers may each include a waveguide layer that includes a diffraction grating.

The interference element may include a first light shielding region positioned between the two first incident regions and a second light shielding region positioned between the two second incident regions. The optical coupling layers may include an optical coupling layer positioned at a location corresponding to the two first incident regions and the first light shielding region, or the two second incident regions and the second light shielding region. The second pixels may include two second pixels positioned at a location corresponding to the two first incident regions. The first pixels may include a first pixel positioned at a location corresponding to the first light shielding region. The fourth pixels may include two fourth pixels positioned at a location corresponding to the two second incident regions. The third pixels may include a third pixel positioned at a location corresponding to the second light shielding region.

The interference element may include a first optical propagation path, a second optical propagation path, and a third optical propagation path coupled between the first optical propagation path and the second optical propagation path.

The first optical propagation path may include an incident portion on which light from one of the two first incident regions or one of the two second incident regions is incident, and an emission portion from which part of the light that is incident is emitted to any of the second pixels or any of the fourth pixels. The second optical propagation path may include an incident portion on which light from the other of the two first incident regions or the other of the two second incident regions is incident, and an emission portion from which part of the light that is incident is emitted to any of the second pixels or any of the fourth pixels.

The interference element may further include a fourth optical propagation path, and the fourth optical propagation path may include an incident portion coupled to the third optical propagation path, and an emission portion from which the light incident from the incident portion is emitted to any of the first pixels or any of the third pixels.

The optical system may include a filter array that includes first bandpass filters that selectively transmit the light in the first wavelength band, and second bandpass filters that selectively transmit the light in the second wavelength band.

The optical system may include a first bandpass filter that selectively transmits the light in the first wavelength band, a second bandpass filter that selectively transmits the light in the second wavelength band, and an array-shaped optical element that causes the light in the first wavelength band transmitted through the first bandpass filter to be incident on the first incident regions, and causes the light in the second wavelength band transmitted through the second bandpass filter to be incident on the second incident regions.

A photodetection device according to another aspect of the present disclosure includes: an image sensor that includes first pixels and second pixels; an interference element that includes incident regions; and illumination that emits light in a first wavelength band and light in a second wavelength band different from the first wavelength band. The interference element causes first interference of part of the light in the first wavelength band incident on two incident regions that are included in the incident regions and that are adjacent to each other, and guides resultant light of the first interference to any of the first pixels and guides another part of the light in the first wavelength band incident on the two incident regions to any of the second pixels. The interference element also causes second interference of part of the light in the second wavelength band incident on the two incident regions, and guides resultant light of the second interference to any of the first pixels and guides another part of the light in the second wavelength band incident on the two incident regions to any of the second pixels.

The illumination may emit the light in the first wavelength band and the light in the second wavelength band simultaneously. The illumination may emit the light in the first wavelength band and the light in the second wavelength band in time division.

The first optical propagation path, the second optical propagation path, and the third optical propagation path may be configured with a photonic crystal. The first optical propagation path, the second optical propagation path, the third optical propagation path, and the fourth optical propagation path may be configured with a photonic crystal.

Embodiments of a photodetection device according to the present disclosure are described below with reference to the drawings.

Outline of First Embodiment

FIG. 1 is a schematic diagram that illustrates the outline of a configuration of a photodetection device according to a first embodiment of the present disclosure. The photodetection device includes an optical system 101, an interference element 106, and an image sensor 109. For convenience in description, FIG. 1 depicts the interference element and the image sensor in cross section. To facilitate understanding of the drawings, three-axis directions x, y, and z based on a left-hand system are also depicted in most of the drawings in and after FIG. 1. Specific examples of constituents are described below.

The image sensor 109 includes first pixels 110, second pixels 111, third pixels 112, and fourth pixels 113.

Reflected light from the object whose three-dimensional shape or distance is desired to be precisely measured is incident on the optical system 101 as incident light.

The optical system 101 causes light in a first wavelength band 102 and light in a second wavelength band 103 to be incident on the interference element 106. The interference element 106 includes first incident regions 104 and second incident regions 105. The optical system 101 causes the light in the first wavelength band 102 to be incident mainly on the first incident regions 104 of the interference element 106. The optical system 101 further causes the light in the second wavelength band 103 to be incident mainly on the second incident regions 105.

The center wavelength of the light in the second wavelength band 103 is different from that of the light in the first wavelength band 102. It is more desirable, in terms of the possibility of precise determination of a step on or the shape of an object, that the band of the light in the second wavelength band 103 and the band of the light in the first wavelength band 102 have no overlapping. In addition, it is more desirable, in terms of the possibility of increase in measurement range while bringing the center wavelengths of the light in the two wavelength bands closer to each other, that each of the bandwidths of the light in the first wavelength band 102 and the light in the second wavelength band 103 be 20 nm or less and it is still more desirable that each of the bandwidths be 5 nm or less.

It is sufficient for the first incident regions 104 and the second incident regions 105 present in the interference element 106 to include openings that can transmit at least light and a physical structure therefor may be omitted. The first incident regions 104 and the second incident regions 105 may be physically the same as each other. The "first" incident regions and the "second" incident regions are separately described herein since the properties of the light incident on each incident region differ.

Part of the light incident from at least a pair of incident regions adjacent to each other, which is included in the light incident on the first incident regions 104, is caused to interfere with each other in the interference element 106 to be emitted to the side of the image sensor 109 as interference light 107. Another part of the light incident from the pair of incident regions is emitted directly to the side of the image sensor 109 as transmitted light 108 without being caused to interfere with each other. Similar to the light incident on the first incident regions 104, the light incident on the second incident regions 105 is also emitted to the side of the image sensor 109 as the interference light 107 and the transmitted light 108.

It is desirable that the distance between the interference element 106 and the image sensor 109 be short so as to efficiently cause the interference light 107 and the transmitted light 108 to be incident on pixels of the image sensor 109, that is, so as to increase the coupling efficiency. The distance is desirably 100 μm or less and is more desirably 10 μm or less.

The interference light 107 generated from the light in the first wavelength band 102 is guided mainly to the first pixels 110 in the image sensor 109 and the transmitted light 108 of the first wavelength band 102 is guided mainly to the second pixels 111. Similarly, the interference light 107 generated from the light in the second wavelength band 103 and the transmitted light 108 of the second wavelength band 103 are guided mainly to the third pixels 112 and the fourth pixels 113, respectively.

It is here sufficient for the first pixels 110, the second pixels 111, the third pixels 112, and the fourth pixels 113 to be photodetectors, such as photodiodes, and may be detectors with physically the same structures. Herein the "first" to "fourth" pixels are separately described since the properties of the light incident on each pixel differ.

To process electric signals obtained from the image sensor 109, the photodetection device further includes a first computation unit 114, a second computation unit 115, and a third computation unit 118. Information on the intensity of the light incident on the first pixels 110 and the second pixels 111 is input to the first computation unit 114 as electric signals. On the basis of the input signals, the first computation unit 114 calculates and outputs first phase difference information 116. The first phase difference information 116 corresponds to phase difference information with respect to the center wavelength in the first wavelength band, that is, $\lambda_1$ of a related-art example.

Similarly, information on the intensity of the light incident on the third pixels 112 and the fourth pixels 113 is input to the second computation unit 115 as electric signals. On the basis of the input signals, the second computation unit 115 calculates and outputs second phase difference information 117. The second phase difference information 117 corresponds to phase difference information with respect to the center wavelength in the second wavelength band, that is, $\lambda_2$ of a related-art example.

On the basis of the first phase difference information 116 and the second phase difference information 117, the third computation unit 118 calculates and outputs equivalent phase difference information 119, that is, phase difference information with respect to $\lambda_{\mathit{eff}}$ of a related-art example.

Such a configuration can achieve a photodetection device that has an optical part smaller in size, is less susceptible to the influence of an ambient environment, and can correctly measure the shape of an object even when the object includes a step beyond the wavelength of light.

<Specific Configuration Examples of Optical System>

Specific configuration examples of the optical system 101 are described next with reference to FIG. 2 and FIGS. 3A to 3F.

Figure 2:
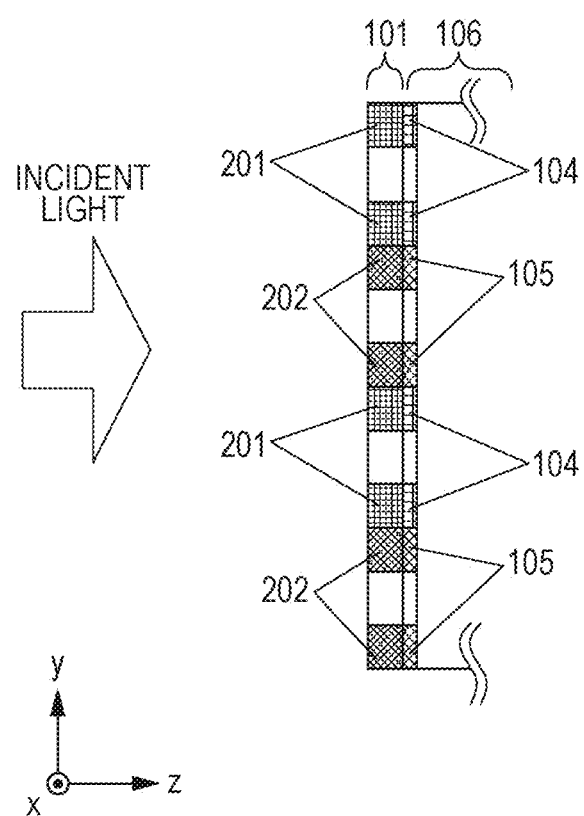
FIG. 2 illustrates a specific example of an optical system according to the first embodiment of the present disclosure.

FIG. 2 illustrates a filter array as part of the optical system 101. The filter array includes first bandpass filters 201 and second bandpass filters 202 arranged so as to be close to the light incident side of the interference element 106. The first bandpass filters 201 have wavelength characteristics of transmitting light in the first wavelength band and are arranged so as to be adjacent to the first incident regions 104. The second bandpass filters 202 have wavelength characteristics of transmitting light in the second wavelength band and are arranged so as to be adjacent to the second incident regions 105. The bandpass filter is manufactured by for example, forming a dielectric multilayered film or a film with a pigment. In the optical system 101, the regions in which no bandpass filters are present are desirably light shielding regions.

Figure 3A:
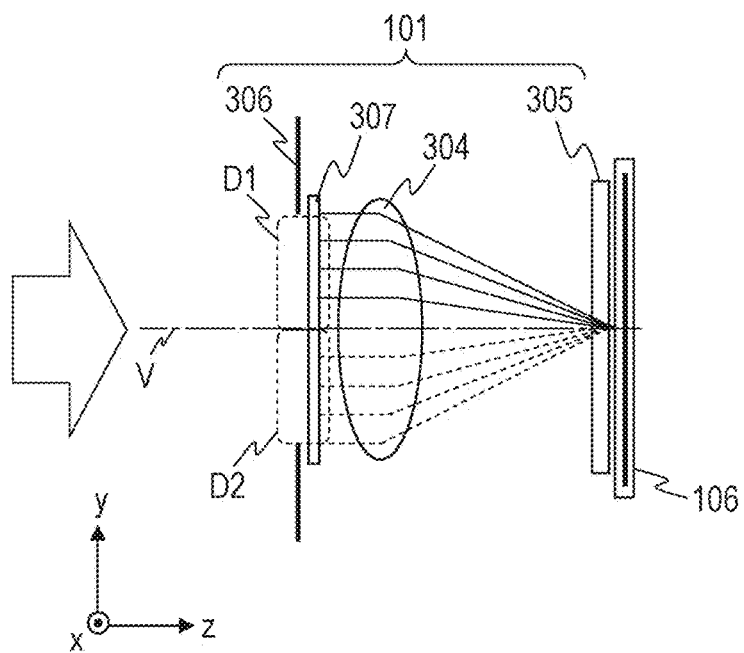
FIG. 3A illustrates another specific example of the optical system according to the first embodiment of the present disclosure.
Figure 3B:
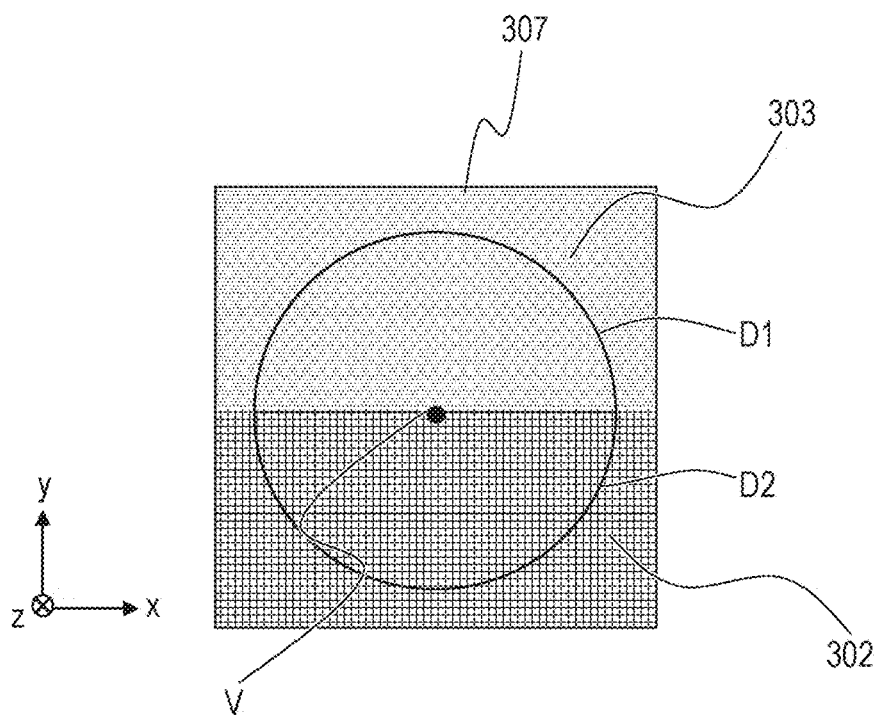
FIG. 3B illustrates another specific example of the optical system according to the first embodiment of the present disclosure.
Figure 3C:
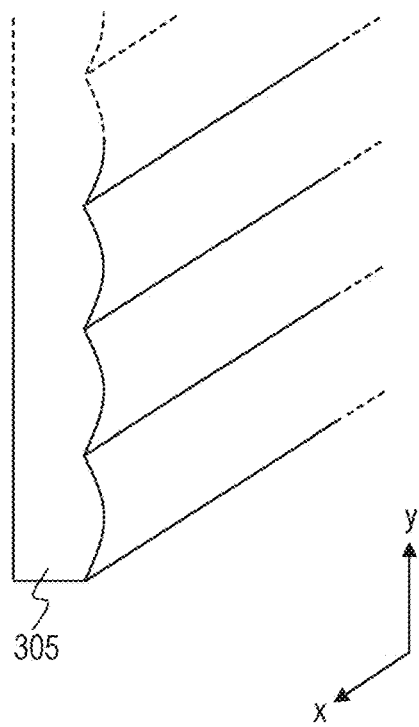
FIG. 3C illustrates another specific example of the optical system according to the first embodiment of the present disclosure.
Figure 3D:
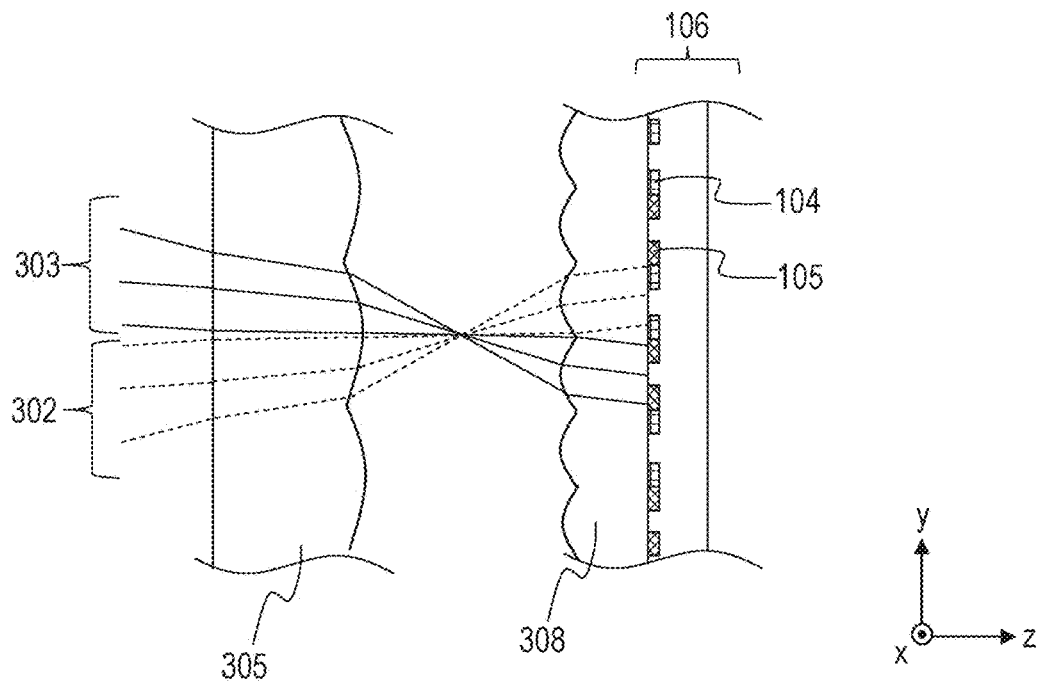
FIG. 3D illustrates another specific example of the optical system according to the first embodiment of the present disclosure.

FIGS. 3A to 3D illustrate an example in which the optical system 101 includes a bandpass filter and an array-shaped optical element arranged near a pupil region. The optical system 101 includes an aperture 306 having the pupil region, a filter array 307, a lens 304, and an array-shaped optical element 305. FIG. 3A schematically illustrates a configuration of the optical system 101 and FIG. 3B illustrates a planar configuration of the filter array 307. FIG. 3C is a schematic perspective view of the array-shaped optical element 305 and FIG. 3D schematically illustrates light that passes through the optical system 101 to be incident on the interference element 106.

As illustrated in FIGS. 3A and 3B, the pupil region of the aperture 306 is divided into a region D1 and a region D2 by a plane that includes an optical axis V of the optical system 101 and expands in a horizontal direction. The filter array 307 includes a second bandpass filter 303 arranged in the region D1 and a first bandpass filter 302 arranged in the region D2.

The incident light that passes through the first optical region D1 and the second optical region D2 is focused through the lens 304 to be incident on the array-shaped optical element 305. The array-shaped optical element 305 is for example, a lenticular lens where cylindrical lenses that each extend in the x direction are arranged in the y direction. The array-shaped optical element 305 causes light in the first wavelength band, which passes through the first bandpass filter 302, to be incident on the first incident regions 104 and causes light in the second wavelength band, which passes through the second bandpass filter 303, to be incident on the second incident regions 105. To increase the incidence efficiency on the first incident regions 104 and the second incident regions 105, a microlens array 308 may be arranged on a surface of the interference element 106.

As described below, the filter array 307 and the array-shaped optical element 305 may have shapes illustrated in FIGS. 3E and 3F, respectively.

The transmission wavelength characteristics of the first bandpass filter 302 and the second bandpass filter 303 are similar to the transmission wavelength characteristics of the first bandpass filter 201 and the second bandpass filter 202 respectively, which are described with reference to FIG. 2. What differs is the largeness in size of each bandpass filter and when the size of a bandpass filter is large, it is advantageous in that the manufacturing of bandpass filters is facilitated. Replacing a bandpass filter only with a bandpass filter with a different center wavelength can vary the measurable range.

Figure 26:
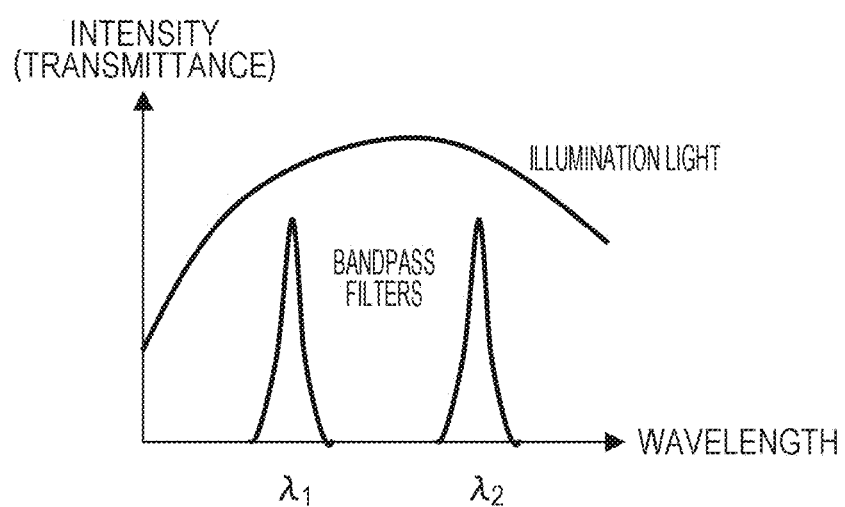
FIG. 26 illustrates an example of the relation between illumination light and bandpass filters.
Figure 27:
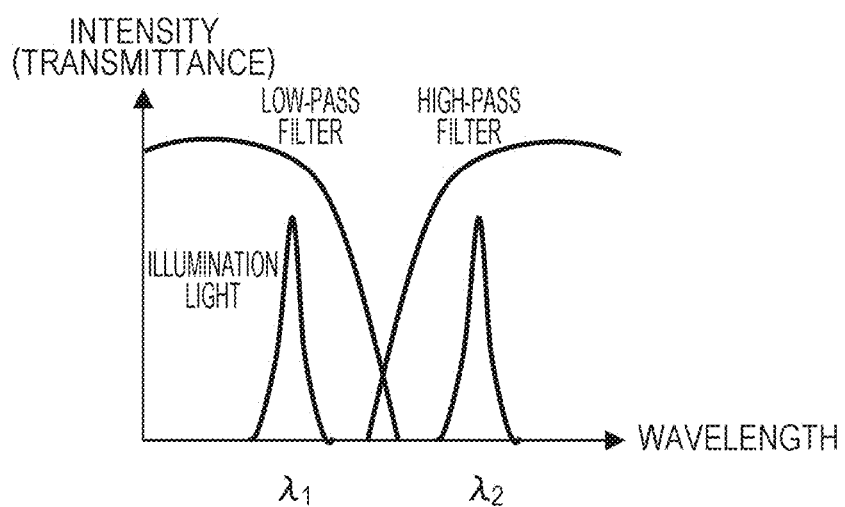
FIG. 27 illustrates another example of the relation between illumination light and bandpass filters.

In the examples of FIG. 2 and FIGS. 3A to 3F, when the wavelength bandwidth of the incident light is relatively wide like a case where for example, a halogen lamp or a white LED light source is used, light with two wavelength bandwidths can be suitably extracted through bandpass filters (see FIG. 26). When each of the two wavelength bands included in the incident light originally has a bandwidth of a degree the same as or smaller than the transmission wavelength band of each bandpass filter like two laser light sources for example, the transmission bandwidth of each bandpass filter is not necessarily required to be narrow. In such a case, the transmission bandwidth of each bandpass filter may be relatively wide as long as light in two wavelength bands can be separated from each other. Instead of bandpass filters, a low-pass filter that transmits light in the first wavelength band and a high-pass filter that transmits light in the second wavelength band may be used (see FIG. 27). An optical filter with a wide transmission bandwidth can be easily manufactured.

<Arrangement Examples of Incident Regions>

While FIG. 1 illustrates the interference element 106 as a cross-sectional view, arrangement examples of the incident regions in the interference element 106 viewed from the front, that is, the light incident side are described using FIGS. 4A to 4E.

Figure 4A:
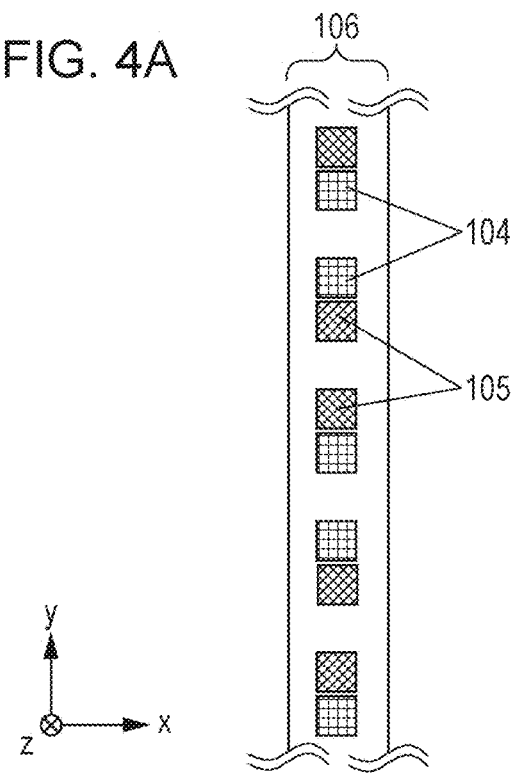
FIG. 4A illustrates an arrangement example of incident regions according to the first embodiment of the present disclosure.

FIG. 4A illustrates an example in which the first incident regions 104 and the second incident regions 105 are arranged together in a column. Use of such a configuration enables a one-dimensional shape or distance information of a measured object to be measured with a linear image sensor.

Figure 4B:
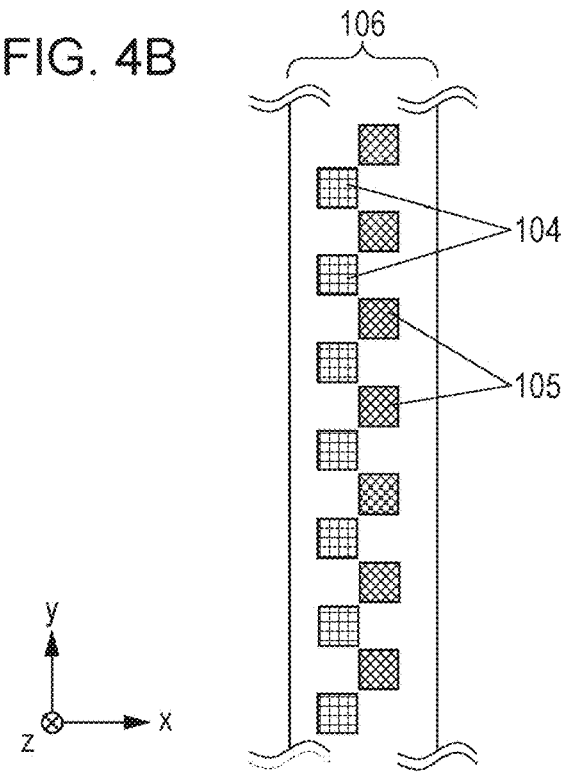
FIG. 4B illustrates an arrangement example of the incident regions according to the first embodiment of the present disclosure.

FIG. 4B illustrates an example in which the first incident regions 104 and the second incident regions 105 are arranged in respective columns. Use of such a configuration has an advantage that when the interference element is manufactured with a grating, the manufacturing is facilitated as described below.

FIG. 4C illustrates two-dimensional expansion of the arrangement of the incident regions illustrated in FIG. 4B. According to the arrangement, a two-dimensional shape or distance information of a measured object can be measured as an image.

FIG. 4D illustrates another two-dimensional arrangement example of the incident regions. The first incident regions 104 and the second incident regions 105 are arranged alternately in two columns each. When in the present example, bandpass filters are arranged so as to be close to each incident region, the width of each bandpass filter can be ensured to be wide, that is, can be caused to be a width corresponding to two columns of the incident regions and accordingly, it is advantageous in that the manufacturing of the bandpass filters is facilitated.

Figure 4E:
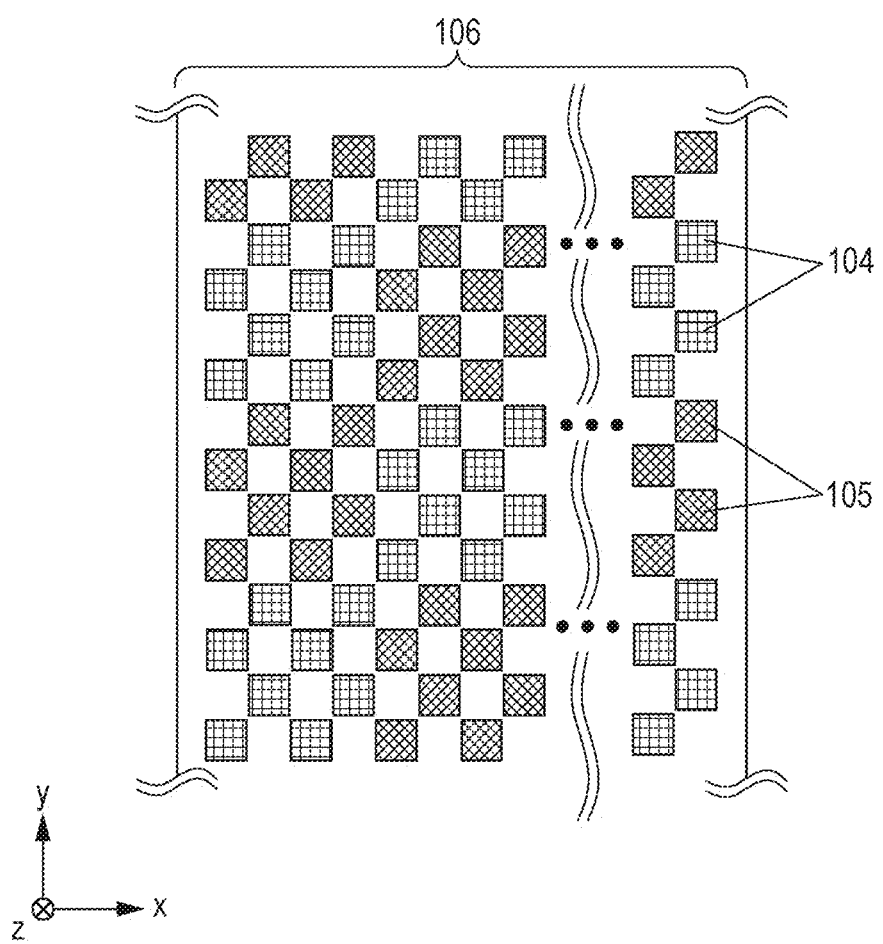
FIG. 4E illustrates an arrangement example of the incident regions according to the first embodiment of the present disclosure.

FIG. 4E illustrates still another two-dimensional arrangement example of the incident regions. The first incident regions 104 and the second incident regions 105 are arranged in units of four columns and four rows, that is, in units of eight regions in total. Also in this case, the width of each bandpass filter can be ensured to be wide, that is, can be caused to be a width corresponding to four columns and accordingly, it is advantageous in that the manufacturing of bandpass filters is facilitated.

The shape of an incident region viewed from the front is not necessarily required to be a square and may be a circle, a rectangle, or the like.

When as illustrated in FIG. 2, a filter array arranged so as to be close to the light incident side of the interference element 106 is used as the optical system 101, a filter array may be used, where the first bandpass filters 201 and the second bandpass filters 202 are arranged according to the arrangement of the first incident regions 104 and the second incident regions 105 as illustrated in FIGS. 4A to 4E.

As described with reference to FIGS. 3A to 3D, when the optical system 101 includes bandpass filters arranged near a pupil region and an array-shaped optical element, the configuration that is described below is employed.

When as illustrated in FIG. 4A, the first incident regions 104 and the second incident regions 105 are one-dimensionally arranged in the y direction in the interference element 106, the filter array 307 where the second bandpass filter 303 and the first bandpass filter 302 are arranged in the y direction as illustrated in FIG. 3A and the array-shaped optical element (lenticular lens) 305 where cylindrical lenses extending in the x direction are arranged in the y direction as illustrated in FIG. 3C are used. In this case, since the first incident regions 104 and the second incident regions 105 of the interference element 106 are one-dimensionally arranged, the length of the array-shaped optical element 305 in the x direction may be a length that corresponds to one pixel.

When as illustrated in FIGS. 4B to 4D, the interference element 106 where the first incident regions 104 and the second incident regions 105 are arranged in different columns is used, a filter array where the second bandpass filters 303 and the first bandpass filters 302 are arranged in the x direction and a lenticular lens where cylindrical lenses extending in the y direction are arranged in the x direction is used. In other words, what is obtained by exchanging the respective arrangements in the x direction and the y direction of the filter array 307 illustrated in FIG. 3A and the array-shaped optical element 305 illustrated in FIG. 3C is used. When as illustrated in FIGS. 4B and 4C, the interference element 106 where the first incident regions 104 in one column and the second incident regions 105 in one column are arranged as a unit is used, each cylindrical lens of the lenticular lens has a width that corresponds to two pixels. When as illustrated in FIG. 4D, the interference element 106 where the first incident regions 104 in two columns and the second incident regions 105 in two columns are arranged as a unit is used, each cylindrical lens of the lenticular lens has a width that corresponds to four pixels.

Figure 3E:
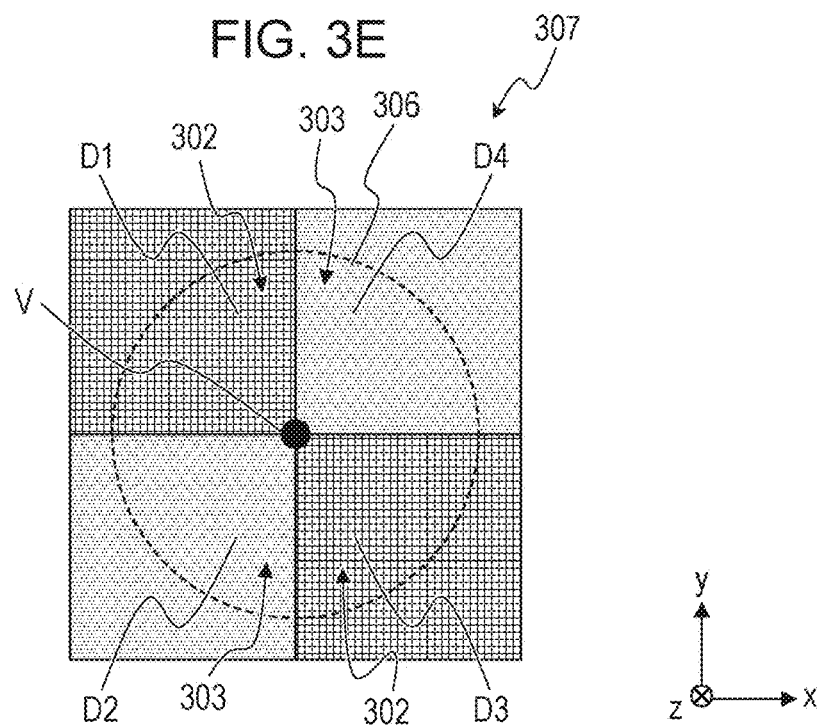
FIG. 3E illustrates still another specific example of the optical system according to the first embodiment of the present disclosure.
Figure 3F:
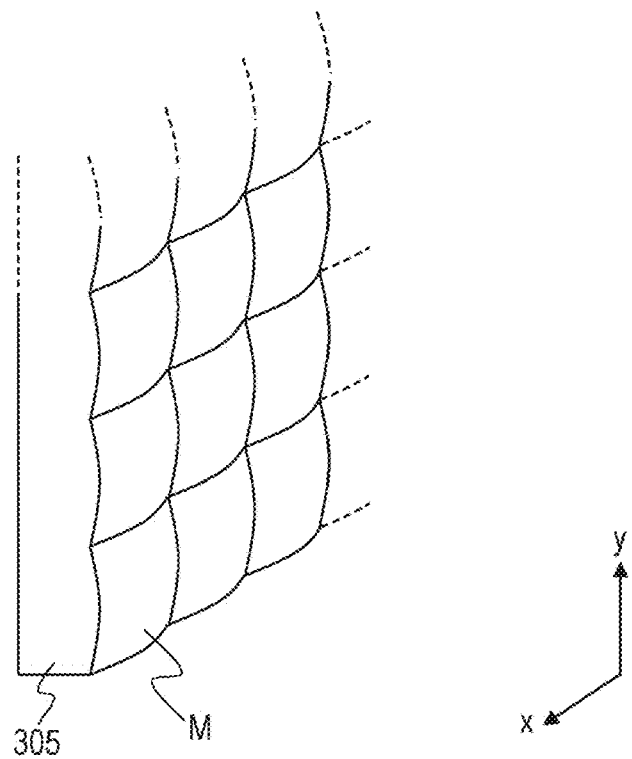
FIG. 3F illustrates still another specific example of the optical system according to the first embodiment of the present disclosure.

When as illustrated in FIG. 4E, the interference element 106 where the first incident regions 104 and the second incident regions 105 are arranged in a check pattern is used, the filter array 307 illustrated in FIG. 3E is used. The pupil region of the aperture 306 is divided into regions D1 to D4 by two planes that include an optical axis V of the optical system 101 and that are orthogonal to each other. The filter array 307 includes the second bandpass filters 303 arranged in the regions D2 and D4 and the first bandpass filters 302 arranged in the regions D1 and D3. As illustrated in FIG. 3F, a microlens array where microlenses M are arranged in the x direction and the y direction is used for the array-shaped optical element 305. Each microlens M corresponds to the size of 16 pixels, which are arranged in four columns and four rows in the x direction and the y direction, respectively.

<Specific Configuration Example of Interference Element>

A specific configuration example of the interference element 106 and its arrangement relation to pixels are described next with reference to FIGS. 5A to 5D and FIGS. 6A to 6D.

FIGS. 5A to 5D illustrate examples of cases where optical coupling layers are used for the interference element 106 as cross-sectional views.

Each of optical coupling layers 502 includes a waveguide layer 504 where a grating 503 is formed. Each waveguide layer 504 is positioned at a location corresponding to two incident regions that are included in the first incident regions 104 and that are adjacent to each other or to two incident regions that are included in the second incident regions 105 and that are adjacent to each other. A base of the interference element 106 may be formed of $SiO_2$ for example. The waveguide layer 504 is a layer with a refractive index that is higher than that of the base and may be formed of $Ta_2O_5$ for example. The waveguide layer 504 is not limited to a single layer and may be made up of layers while layers that each have a low refractive index are sandwiched therebetween.

On an interface of the waveguide layer 504 on at least the incident side, the gratings 503 are positioned with predetermined pitches. The grating 503 is a straight grating and the directions of the lattice vectors of the grating 503 are parallel to the vertical direction on the planes of FIGS. 5A to 5D within a plane of the optical coupling layer 502.

On the light incident side of the interference element 106, light shielding regions 501 are arranged in the regions that are neither the first incident regions 104 nor the second incident regions 105. That is, light shielding regions are positioned between two incident regions that are included in the first incident regions 104 and that are adjacent to each other and between two incident regions that are included in the second incident regions 105 and that are adjacent to each other. The light shielding region 501 is formed of a metal material with reflectivity, such as Al, Ag, or Au, and is thick enough to block light in the first and second wavelength bands sufficiently.

An optical path of light incident on the first incident regions 104 is described below using FIG. 5A. When the pitches of the gratings 503 are set so as to couple light in the first wavelength band, part of the light incident on two incident regions 104a and 104b, which are included in the first incident regions and that are adjacent to each other, is incident into the waveguide layer 504 to propagate as waveguide light 506a and waveguide light 506b, respectively. The waveguide light 506a and the waveguide light 506b interfere with each other in the waveguide layer 504 and is emitted as interference light 107a from the waveguide layer 504 to the side of the image sensor 109 to be incident on a pixel 110a, which is one of the first pixels 110. The waveguide light 506a and the waveguide light 506b propagate from the incident regions 104a and 104b, respectively, which are adjacent to each other and that form a pair. The intensity of the interference light 107 depends on a phase difference of light incident on the first incident regions 104. Another part of the light incident on the incident regions 104a and 104b is emitted as transmitted light 108a and transmitted light 108b to the side of the image sensor 109 without becoming waveguide light, and is incident on pixels 111a and 111b included in the second pixels 111. Accordingly, a phase difference of lights in the first wavelength band incident on the incident regions 104a and 104b can be determined by detecting the intensities of the lights incident on the pixels 110a, 111a, and 111b.

Figure 5A:
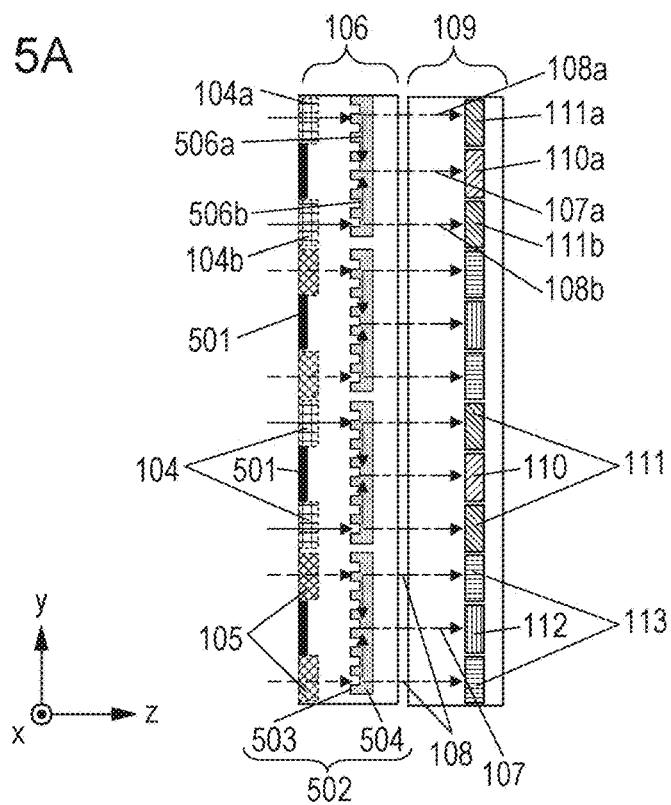
FIG. 5A illustrates a specific example of an interference element according to the first embodiment of the present disclosure.

As illustrated in FIG. 5A, an optical path of light incident on the second incident regions 105 can be explained in a similar manner to the above. The reasons why a phase difference of the lights incident on a pair of incident regions that are included in the second incident regions 105 and that are adjacent to each other can be determined from the intensities of the lights incident on the third pixels 112 and the intensities of the lights incident on the fourth pixels 113 are similar to those of the case regarding the first incident regions.

FIG. 5A illustrates a cross-sectional configuration of the optical coupling layers 502 in the interference element 106 where the first incident regions 104 and the second incident regions 105 are one-dimensionally arranged as illustrated in FIG. 4A. In this configuration, since both the first incident regions 104 and the second incident regions 105 are present in the directions of the lattice vectors of the grating, the optical coupling layers 502 may be separated to each other. The optical coupling layers 502 may be separated in boundaries between the first incident regions 104 and the second incident regions 105 by media that each have a refractive index lower than that of the waveguide layer 504. According to this manner, no mutual interference occurs between the light in the first wavelength band and the light in the second wavelength band separated through the bandpass filters and thus, a phase difference of lights in the first wavelength band and a phase difference of lights in the second wavelength band can be detected independently.

Figure 5B:
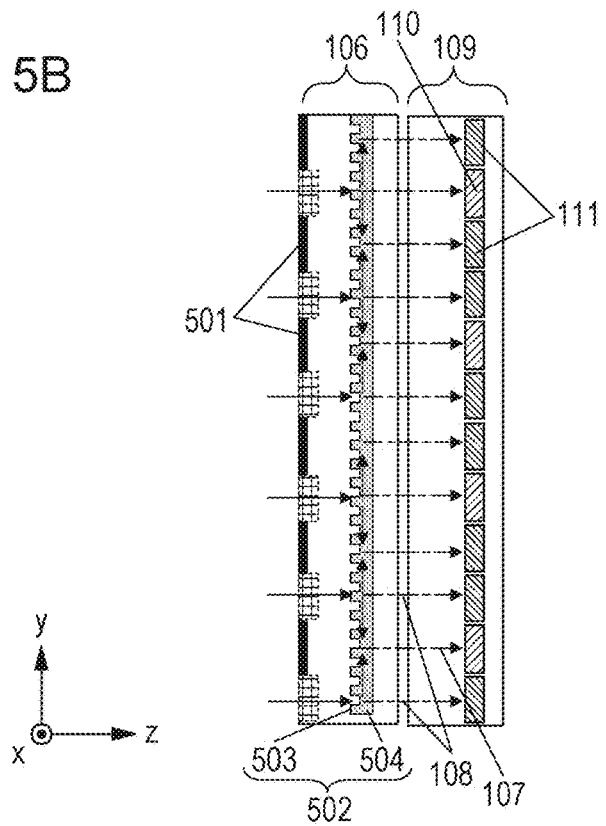
FIG. 5B illustrates a specific example of the interference element according to the first embodiment of the present disclosure.
Figure 5C:
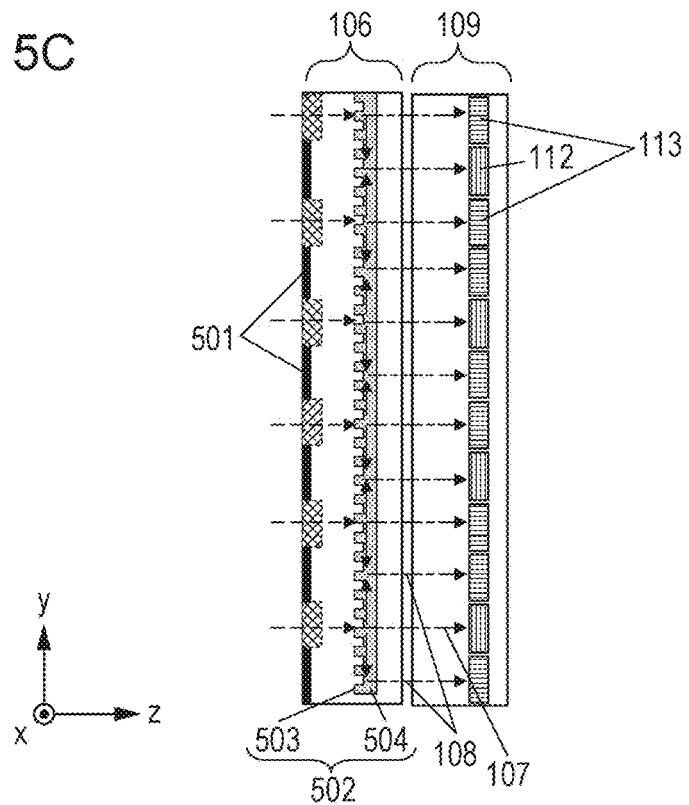
FIG. 5C illustrates a specific example of the interference element according to the first embodiment of the present disclosure.

FIGS. 5B and 5C illustrate cross-sectional configurations of the optical coupling layer 502 in cases where the first incident regions 104 and the second incident regions 105 are arranged in different columns as illustrated in FIGS. 4B, 4C, and 4D. FIG. 5B is a cross-sectional view taken when the interference element 106 is cut in a column of the first incident regions 104. FIG. 5C is a cross-sectional view taken when the interference element 106 is cut in a column of the second incident regions 105. Since in this configuration, only the first incident regions 104 or the second incident regions 105 are present in the directions of the lattice vectors of the grating, a phase difference of lights in the first wavelength band and a phase difference of lights in the second wavelength band can be independently detected without separating the optical coupling layer. The configuration where the optical coupling layer 502 is not separated makes the manufacturing the optical coupling layer 502 easier.

Figure 5D:
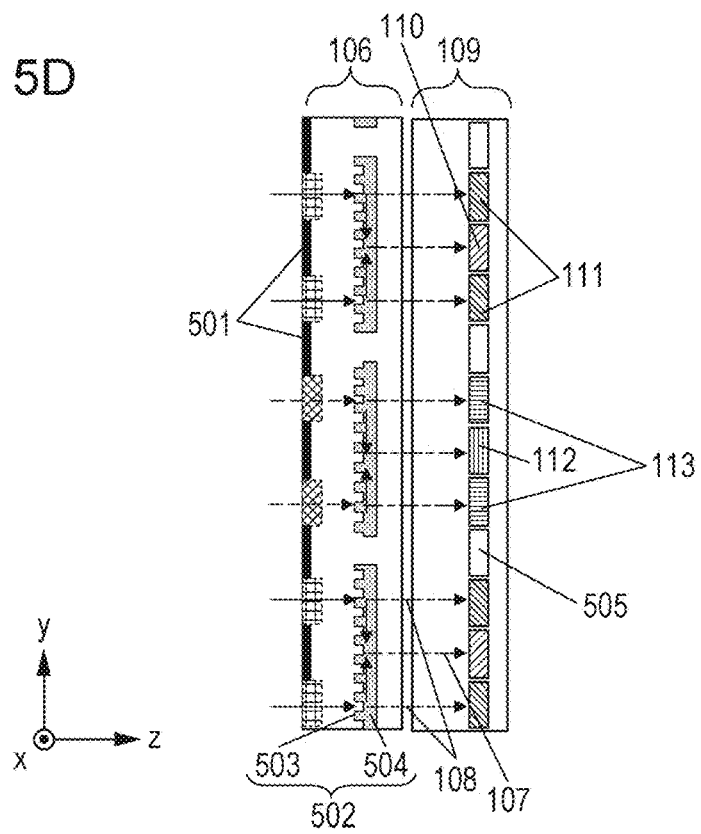
FIG. 5D illustrates a specific example of the interference element according to the first embodiment of the present disclosure.

FIG. 5D illustrates a cross-sectional configuration of the optical coupling layers 502 in the case where the first incident regions 104 and the second incident regions 105 are arranged in a check pattern as illustrated in FIG. 4E. Since in this configuration, similar to FIG. 5A, both the first incident regions 104 and the second incident regions 105 are present in the directions of the lattice vectors of the gratings, the optical coupling layers may be separated to each other. The optical coupling layers may be separated in boundaries between the first incident regions 104 and the second incident regions 105. Pixels immediately under the portions where the optical coupling layers are separated may be referred to as unused pixels 505 and excluded in calculating phase difference information.

<Another Example of Specific Configuration of Interference Element>

FIGS. 6A to 6D illustrate examples of cases where a photonic crystal is used for the interference element 106 as cross-sectional views.

A photonic crystal 601 is used so as to form an optical propagation path. The optical propagation path includes at least a first optical propagation path 602 and a second optical propagation path 603, and a third optical propagation path 604 that couples the first optical propagation path 602 and the second optical propagation path 603. An incident portion of the first optical propagation path 602 is arranged at a position different from the position of an incident portion of the second optical propagation path 603. An emission portion of the first optical propagation path 602 is arranged at a position different from the position of an emission portion of the second optical propagation path 603. The optical propagation path illustrated in FIG. 6A further includes a fourth optical propagation path 605. The fourth optical propagation path 605 is coupled to the third optical propagation path 604 and allows light incident from the third optical propagation path 604 to propagate. When the interference light and the transmitted light are separately detected in a similar manner to the case where the optical coupling layers 502 configure the interference element, it is desirable for the optical propagation path to include the fourth optical propagation path 605. The intensities of the emission light of the first optical propagation path 602 and the emission light of the second optical propagation path 603 vary, depending on a phase difference of the lights incident on the first optical propagation path 602 and the second optical propagation path 603. Thus, phase difference information can be determined even in a configuration where the fourth optical propagation path 605 is not present.

The photonic crystal 601 is configured so as to have a periodic arrangement of for example, cavities, regions different in refractive index, dielectric posts, or the like, and an optical propagation path is formed by removing part of the periodic arrangement. The positions of the incident portions of the first optical propagation path 602 and the second optical propagation path 603 respectively correspond to two incident regions that are included in the first incident regions 104 and that are adjacent to each other. That is, the first optical propagation path 602 and the second optical propagation path 603 are respectively coupled to two incident regions that are included in the first incident regions 104 and that are adjacent to each other. The first incident regions 104 include pairs of two incident regions that are adjacent to each other as described above. The second incident regions 105 also include pairs of two incident regions that are adjacent to each other as described above. Pairs of the first and second optical propagation paths are arranged at a location corresponding to the pairs of the incident regions in a manner similar to the above. The third optical propagation path that couples the first optical propagation path and the second optical propagation path, and the fourth optical propagation path coupled to the third optical propagation path are arranged at a location corresponding to each pair of the first and second optical propagation paths.

Each of the emission portions of the first optical propagation path 602 and the second optical propagation path 603 is disposed so as to be adjacent to corresponding one of the second pixels 111. The emission portion of the fourth optical propagation path 605 is disposed so as to be adjacent to corresponding one of the first pixels 110. Similarly, each of the emission portions of the first and second optical propagation paths corresponding to the other first incident regions 104 is disposed so as to be adjacent to corresponding one of the second pixels 111. Each of the emission portions of the fourth optical propagation paths corresponding to the other first incident regions 104 is disposed so as to be adjacent to corresponding one of the first pixels 110. Similarly, each of the emission portions of the first and second optical propagation paths corresponding to the second incident regions 105 is disposed so as to be adjacent to corresponding one of the fourth pixels 113. Each of the emission portions of the fourth optical propagation paths corresponding to the second incident regions 105 is disposed so as to be adjacent to corresponding one of the third pixels 112.

Since in this configuration, both the first incident regions 104 and the second incident regions 105 are present in the direction in which the third optical propagation paths 604 extend, the third optical propagation paths 604 may be separated by leaving a dielectric post in each boundary between the first incident regions 104 and the second incident regions 105. According to this manner, no mutual interference of lights in the first and second wavelength bands separated through the bandpass filters occurs and thus, a phase difference of lights in the first wavelength band and a phase difference of lights in the second wavelength band can be independently detected.

Such a configuration causes part of the light incident from a pair of incident regions that are included in the first incident regions 104 and the second incident regions 105 and that are adjacent to each other to interfere in the third optical propagation path to be emitted from the interference element 106 as the interference light 107. The state of the interference of the light in the third optical propagation path changes, depending on a phase difference of lights incident from a pair of incident regions adjacent to each other. Another part of the lights incident from the incident regions is emitted from the interference element 106 as the transmitted light 108. When the intensities of the interference light 107 and the transmitted light 108 are detected at the pixels of the image sensor 109, similar to the case where the optical coupling layers 502 configure the interference element 106, the phase difference information on lights can be determined.

Figure 6A:
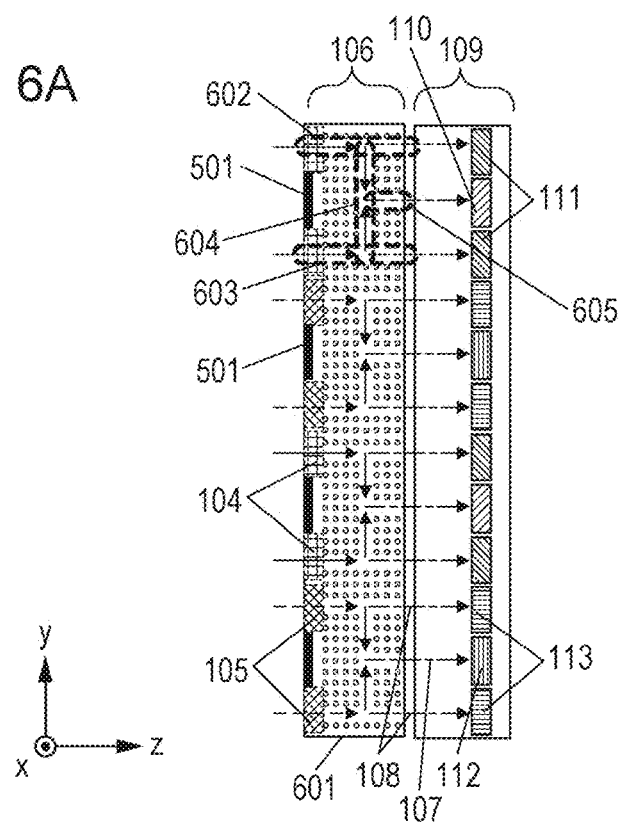
FIG. 6A illustrates another specific example of the interference element according to the first embodiment of the present disclosure.

FIG. 6A illustrates a cross-sectional configuration of the interference element 106 where the first incident regions 104 and the second incident regions 105 are one-dimensionally arranged as illustrated in FIG. 4A.

Figure 6B:
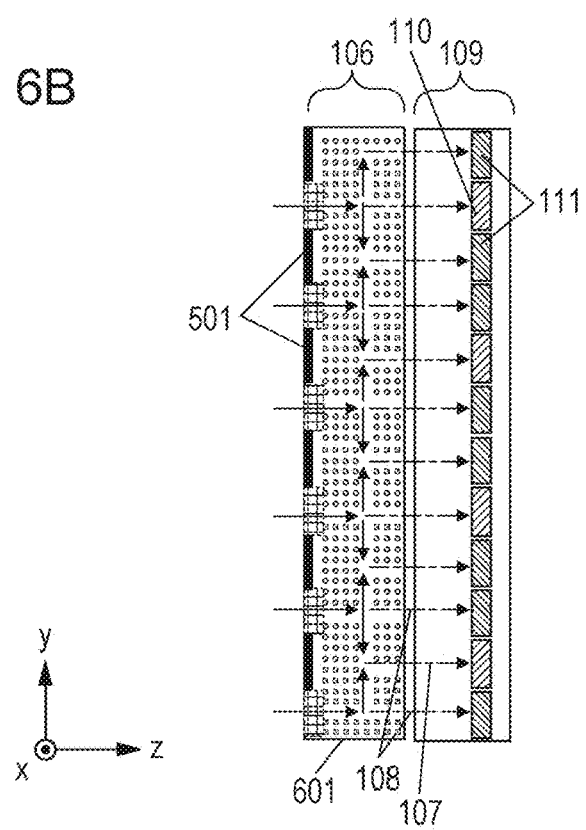
FIG. 6B illustrates another specific example of the interference element according to the first embodiment of the present disclosure.
Figure 6C:
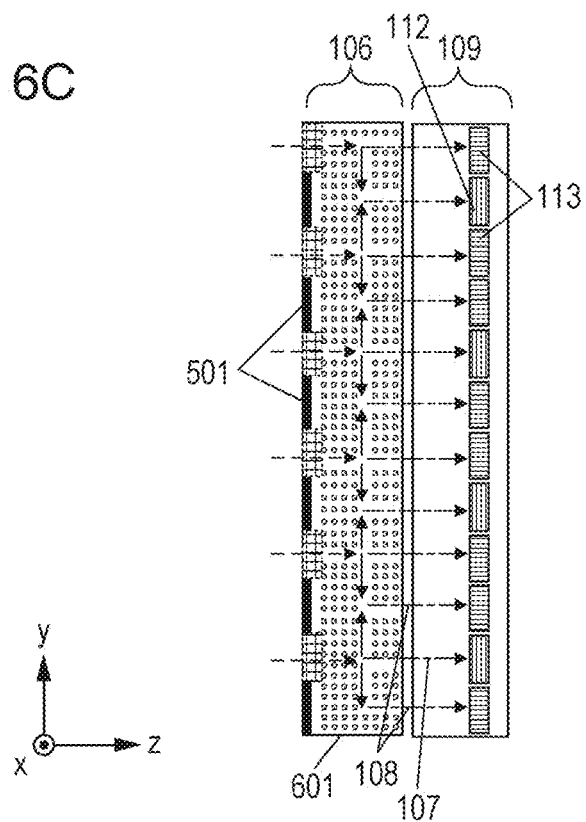
FIG. 6C illustrates another specific example of the interference element according to the first embodiment of the present disclosure.

FIGS. 6B and 6C illustrate cross-sectional configurations of the interference element 106 in the cases where the first incident regions 104 and the second incident regions 105 are arranged in different columns as illustrated in FIGS. 4B, 4C, and 4D. Since in these configurations, only the first incident regions 104 or the second incident regions 105 are present in the direction in which the third optical propagation paths 604 extend, a phase difference of lights in the first wavelength band and a phase difference of lights in the second wavelength band can be independently detected without separating the third optical propagation paths 604.

Figure 6D:
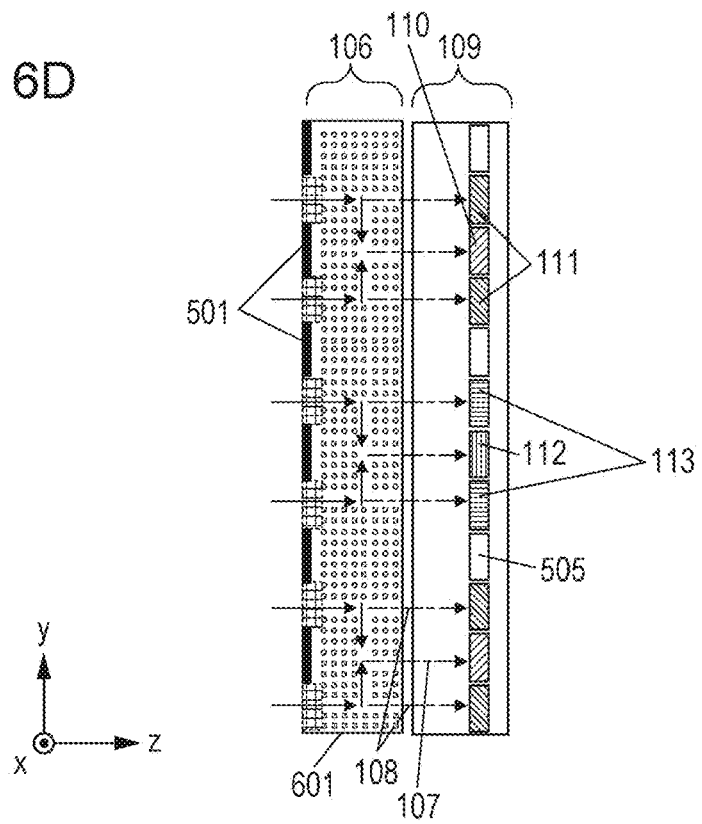
FIG. 6D illustrates another specific example of the interference element according to the first embodiment of the present disclosure.

FIG. 6D illustrates a cross-sectional configuration of the interference element 106 in the case where the first incident regions 104 and the second incident regions 105 are arranged in a check pattern as illustrated in FIG. 4E. FIGS. 6A and 6D illustrate configurations where the first incident regions 104 and the second incident regions 105 are arranged in the same column. In such configurations, when optical propagation paths are separated according to each wavelength band of the incidence from an incident region as illustrated in FIGS. 6A and 6D, a phase difference of lights in the first wavelength band and a phase difference of lights in the second wavelength band can be independently detected.

<Pixel Arrangement of Image Sensor>

While FIG. 1, FIGS. 5A to 5D, and FIGS. 6A to 6D illustrate the image sensor 109 as cross-sectional views, arrangement examples of the pixels in the image sensor 109 viewed from the front, that is, the light incident side are described using FIGS. 7A to 7E.

FIGS. 7A to 7E each illustrate an arrangement example of the pixels in a case where the first incident regions 104 and the second incident regions 105 are arranged as illustrated in FIGS. 4A to 4E. The pixels are arranged so that the interference light 107 of the lights incident on the first incident regions 104 is incident on any pixel included in the first pixels 110, the transmitted light 108 of the light incident on the first incident regions 104 is incident on any pixel included in the second pixels 111, the interference light 107 of the lights incident on the second incident regions 105 is incident on any pixel included in the third pixels 112, and the transmitted light 108 of the light incident on the second incident regions 105 is incident on any pixel included in the fourth pixels 113. It is more desirable that the position of each incident region and the position of each pixel be in close agreement with each other. In other words, it is desirable that those positions have almost no deviation because unnecessary components of crosstalk to each pixel can be reduced.

<Configuration Examples of Computation Units>

Figure 8:
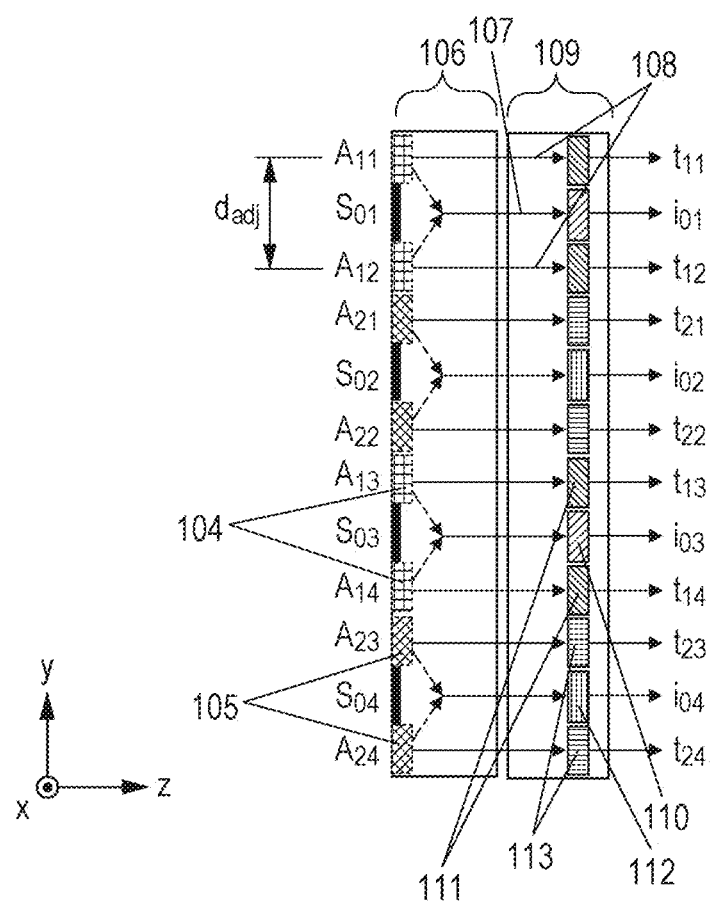
FIG. 8 illustrates an output example of an optical intensity signal according to the first embodiment of the present disclosure.
Figure 9:
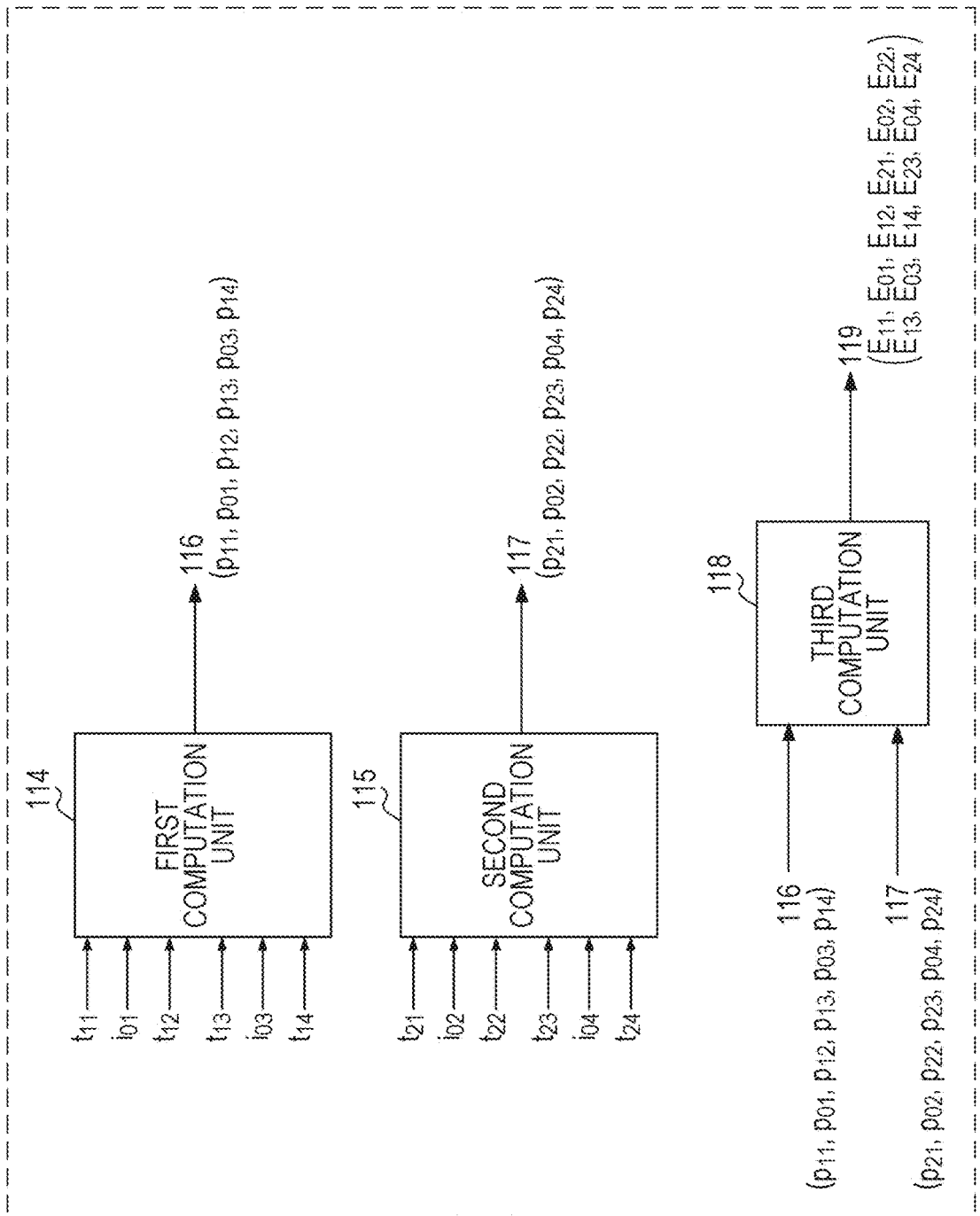
FIG. 9 illustrates specific examples of computation units according to the first embodiment of the present disclosure.

Using FIGS. 8 and 9, flow of signals from the image sensor 109 in the photodetection device illustrated in FIG. 1 and configuration examples of the computation units are described.

As illustrated in FIG. 8, the incident regions, the light shielding regions, and signals output from each pixel of the image sensor are defined. Each signal is output according to the intensity of light incident on each corresponding pixel.

The incident regions and the light shielding regions are referred to as described below. The nth incident region that belongs to the mth incident regions is denoted as $A_{mn}$. The pair of $A_{m1}$ and $A_{m2}$ and the pair of $A_{m3}$ and $A_{m4}$ each form a pair of incident regions, which are included in the mth incident regions and that are adjacent to each other. The nth light shielding region present between the incident regions or a region that is no incident region is denoted as $S_{0n}$.

Signals are referred to as described below. A signal of the transmitted light from a pixel immediately under the incident region $A_{mn}$ or a light shielding region $S_{mn}$ is denoted as $t_{mn}$. A signal of the interference light from a pixel immediately under the incident region $A_{mn}$ or the light shielding region $S_{mn}$ is denoted as $i_{mn}$.

As illustrated in FIG. 9, the first computation unit 114 receives signals $t_{11}$, $i_{01}$, $t_{12}$, $t_{13}$, $i_{03}$, and $t_{14}$ and outputs first phase difference information $p_{11}$, $p_{01}$, $p_{12}$, $p_{13}$, $p_{03}$, $p_{14}$. The second computation unit 115 receives signals $t_{21}$, $i_{02}$, $t_{22}$, $t_{23}$, $i_{04}$, and $t_{24}$ and outputs second phase difference information $p_{21}$, $p_{02}$, $p_{22}$, $p_{23}$, $p_{04}$, $p_{24}$. The third computation unit 118 receives the first phase difference information $p_{11}$, $p_{12}$, $p_{13}$, $p_{03}$, $p_{14}$ and the second phase difference information $p_{21}$, $p_{02}$, $p_{22}$, $p_{23}$, $p_{04}$, $p_{24}$ and outputs equivalent phase difference information $E_{11}$, $E_{01}$, $E_{12}$, $E_{21}$, $E_{02}$, $E_{22}$, $E_{13}$, $E_{03}$, $E_{14}$, $E_{23}$, $E_{04}$, $E_{24}$. The pieces of the information described above may be represented as electric signals or may be information held in memory of a computer or the like. The first computation unit 114, the second computation unit 115, and the third computation unit 118 are an example of the computation circuitry.

The first phase difference information 116 is phase difference information with respect to the center wavelength of the first wavelength band, that is, $\lambda_1$ of a related-art example, and the second phase difference information 117 is phase difference information with respect to the center wavelength of the second wavelength band, that is, $\lambda_2$ of a related-art example. Phase difference information of lights separated from the position of the incident region $A_{mn}$ or the light shielding region $S_{mn}$ by an adjacent distance $d_{adj}$, that is, a distance between a pair of incident regions adjacent to each other is denoted as $p_{mn}$.

Equivalent phase difference information 119 is phase difference information with reference to an equivalent wavelength, that is, $\lambda_{eff}$ of a related-art example. Equivalent phase difference information of lights separated from the position of the incident region $A_{mn}$ or the light shielding region $S_{mn}$ by an adjacent distance $d_{adj}$, that is, a distance between a pair of incident regions adjacent to each other is denoted as $E_{mn}$.

The first computation unit 114 determines the phase difference information $p_{11}$, $p_{01}$, $p_{12}$, $p_{13}$, $p_{03}$, $p_{14}$ on each incident region or light shielding region through computation based on the signals $t_{11}$, $i_{01}$, $t_{12}$, $t_{13}$, $i_{03}$, and $t_{14}$ that are output after causing lights in the first wavelength band to interfere with each other or to pass. The determination is enabled by determining the relation between the optical intensity of the interference light 107 or the transmitted light 108 and the phase difference on the incident region or the light shielding region present immediately above through an experiment in advance, causing the relation to be held in memory as a table or a computational expression, and using the held table or computational expression. For example, two first wavelength lights whose phase difference is known are caused to be incident on two incident regions that are included in the first incident regions and that are adjacent to each other, and the intensity of the interference light or the transmitted light is measured. The relation between a phase difference and an optical intensity can be determined empirically by varying the phase difference of the two first wavelength lights and repeating the measurement of the intensity of the interference light or transmitted light. The distance that corresponds to the phase difference can be determined through computation based on the wavelengths of the used lights.

Similar to the first computation unit 114, the second computation unit 115 determines the phase difference information $p_{21}$, $p_{02}$, $p_{22}$, $p_{23}$, $p_{04}$, $p_{24}$ on each incident region or light shielding region through computation based on the signals $t_{21}$, $i_{02}$, $t_{22}$, $t_{23}$, $i_{04}$, and $t_{24}$ that are output after causing lights in the second wavelength band to interfere with each other or to pass.

The third computation unit 118 determines the equivalent phase difference information $E_{11}$, $E_{01}$, $E_{12}$, $E_{21}$, $E_{02}$, $E_{22}$, $E_{13}$, $E_{03}$, $E_{14}$, $E_{23}$, $E_{04}$, $E_{24}$ using the first phase difference information $p_{11}$, $p_{01}$, $p_{12}$, $p_{13}$, $p_{03}$, $p_{14}$ related to light in the first wavelength band and the second phase difference information $p_{21}$, $p_{02}$, $p_{22}$, $p_{23}$, $p_{04}$, $p_{24}$ related to light in the second wavelength band. The equivalent phase difference information can be determined by known techniques described in Japanese Unexamined Patent Application Publication No. 10-221032 or Yeou-Yen Cheng and James C. Wyant: "Two-wavelength phase shifting interferometry", Applied Optics, vol. 23, No. 24, pp. 4539 to 4543.

The phase difference information is not necessarily required to be determined by being caused to correspond to all the incident regions or the light shielding regions, that is, to all the pixels of the image sensor. The phase difference information may be determined from average phase difference information of regions across incident regions or a light shielding region, which are for example, the regions $A_{11}$, $S_{01}$, and $A_{12}$ in FIG. 8.

As the phase difference information, it may be unnecessary to determine an actual phase difference value and it is sufficient when the phase difference information is a value related to a phase difference of lights incident between certain regions in the interference element.

The shape of a measured object is determined on the basis of the phase difference information.

Advantages of First Embodiment

According to the present embodiment, interference light is caused inside the interference element 106 arranged so as to be close to the image sensor 109 and thus, a large optical component, such as a one-way mirror or a reference mirror is unnecessary and a photodetection device smaller in size than a conventional photodetection device can be achieved. Since the bandpass filters arranged immediately above the interference element or near the pupil region separate two wavelength bands, it is unnecessary to use a plurality of camera tubes or image sensors and the optical part of the photodetection device may be made smaller in size than that of a conventional photodetection device. Also, since lights in a plurality of wavelength bands are used for measurement, the shape of an object can be correctly measured even when the object includes a step beyond the wavelength of light. Further, since it is unnecessary to route an optical path in air for causing an interference phenomenon, precise measurement results can be obtained, which are less susceptible to the influence of an ambient environment, such as air convection or vibrations.

Second Embodiment

In the first embodiment, lights in two wavelength bands with different center wavelengths are obtained by causing incident light to pass through bandpass filters. According to the first embodiment, even when the incident light has a wide wavelength band of some degree, such as a halogen lamp or a white LED light, use of a bandpass filter with a transmission band narrower than the wavelength band of the incident light enables lights in two wavelength bands to be suitably obtained.

In contrast, when lights in two wavelength bands as incident light each have a wavelength spectrum with a width of the same degree as that of the transmission wavelength band of a bandpass filter originally, an embodiment of a configuration without a bandpass filter is also conceivable. Described below is the embodiment. Examples of such a light source include a laser light source.

Figure 10:
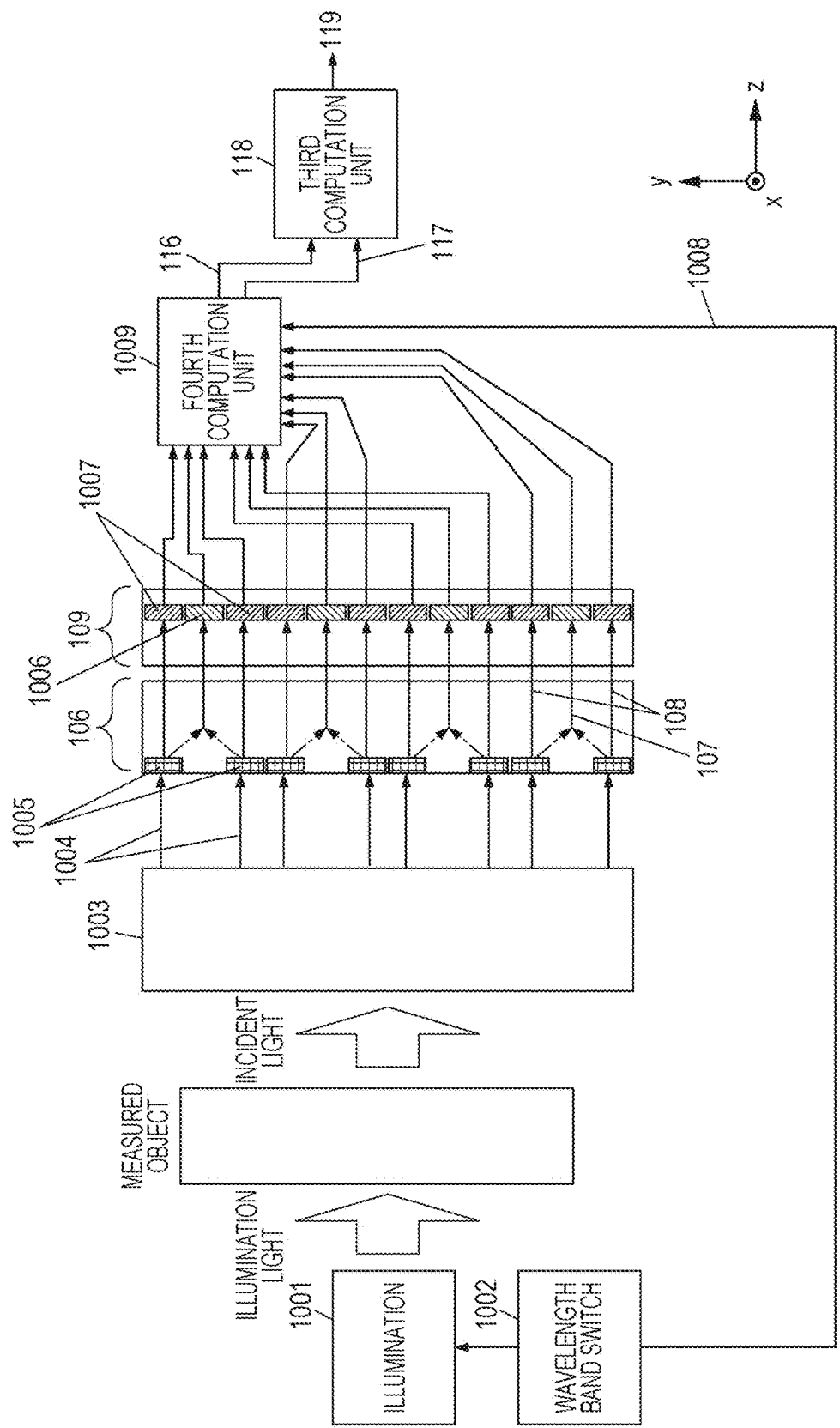
FIG. 10 is a schematic diagram of a configuration of a photodetection device according to a second embodiment of the present disclosure.

FIG. 10 is a diagram for describing a structure according to a second embodiment of the present disclosure.

Illumination 1001 irradiates a measured object with light in a first or second wavelength band. A wavelength band switch 1002 controls the illumination 1001 so that the illumination 1001 switches lights in the two wavelength bands with different center wavelengths in time division to emit the light.

For example, the illumination 1001 may include a wavelength tunable laser light source and the wavelength band switch 1002 may include circuitry that switches the wavelength of the wavelength tunable laser light source. The illumination 1001 may include two laser light sources with different emission wavelength bands and the wavelength band switch 1002 may include circuitry that switches emission or no emission from the two laser light sources alternately. The illumination 1001 may include a light source with a relatively wide wavelength band and bandpass filters and the wavelength band switch 1002 may include a mechanism that alternately switches the bandpass filters arranged on an optical path from the light source.

The light that has passed through or reflected off the measured object is incident on an optical system 1003 as the incident light. The optical system 1003 causes light in a first or second wavelength band 1004 to be incident on incident regions 1005 without dividing the wavelength bands of the incident light in terms of space. The procedure in which interference light 107 and transmitted light 108 are caused in an interference element 106 is similar to that in the first embodiment. The procedure in which the interference light 107 and the transmitted light 108 are incident on first pixels 1006 and second pixels 1007 of an image sensor 109 is also similar to that in the first embodiment. What is different from the first embodiment is that light in the first and second wavelength bands can be incident on any incident region and any pixel.

Optical intensity signals output from the first pixels 1006 and the second pixels 1007 are input to a fourth computation unit 1009. On the basis of the input signals, the fourth computation unit 1009 calculates and outputs first phase difference information 116 and second phase difference information 117. The procedure in which phase difference information is determined from optical intensity signals is similar to that in the first embodiment. What is different is that, on the basis of a synchronization signal 1008 from the wavelength band switch 1002, the first phase difference information 116 is determined using optical intensity signals at a timing of the irradiation with light in the first wavelength band and the second phase difference information 117 is determined using optical intensity signals at a timing of the irradiation with light in the second wavelength band.

Similar to the first embodiment, a third computation unit 118 calculates and outputs equivalent phase difference information 119 based on the first phase difference information 116 and the second phase difference information 117. The third computation unit 118 and the fourth computation unit 1009 are an example of the computation circuitry.

Since such a configuration needs no use of a bandpass filter for an optical system, a photodetection device that is still simpler in configuration can be achieved.

Third Embodiment

The second embodiment describes a configuration where illumination lights in two wavelength bands with different center wavelengths are switched in time division to be emitted. A third embodiment describes a configuration where simultaneous irradiation with illumination lights in two wavelength bands is performed.

Figure 11:
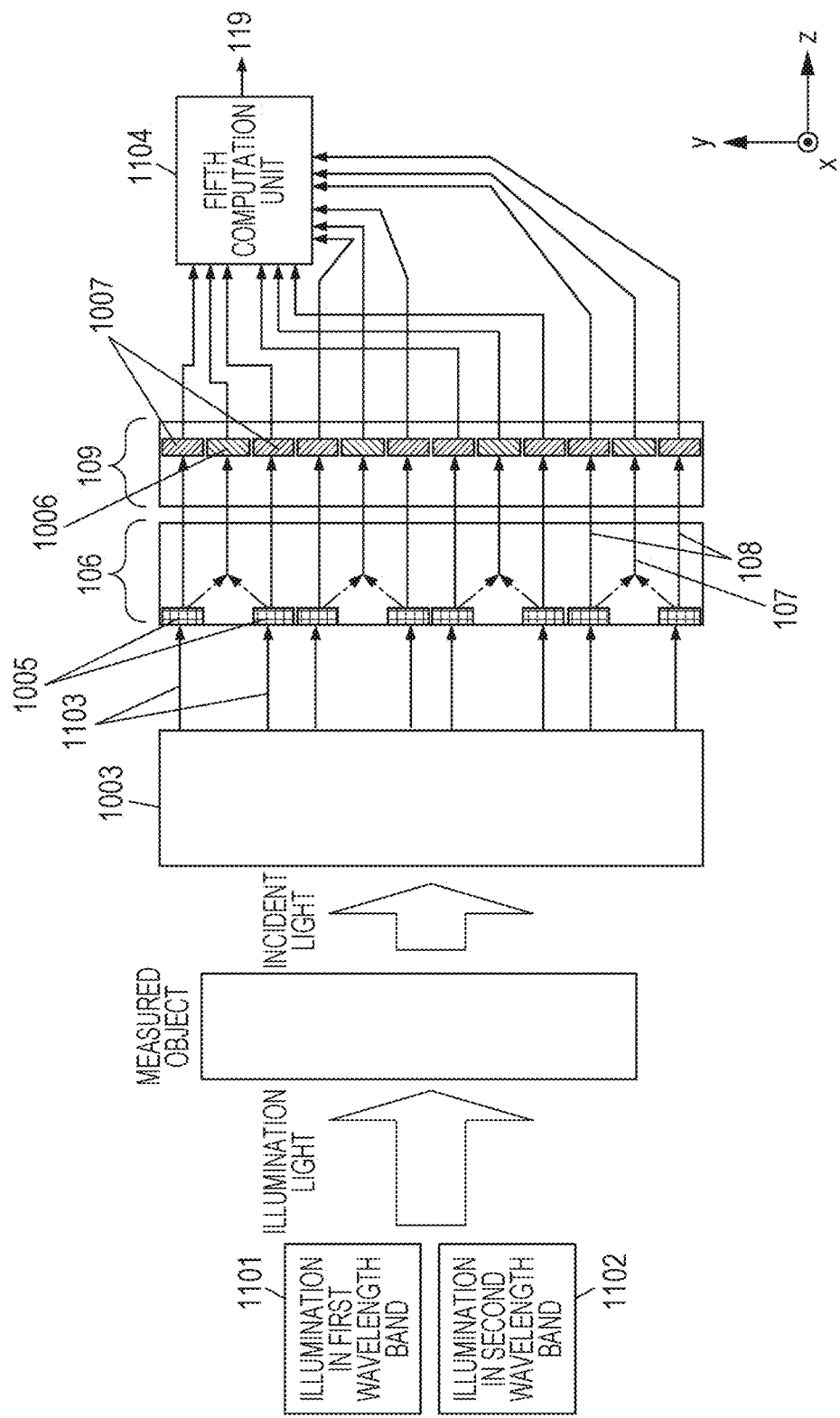
FIG. 11 is a schematic diagram of a configuration of a photodetection device according to a third embodiment of the present disclosure.

FIG. 11 is a diagram for describing a configuration according to the third embodiment of the present disclosure.

A measured object is simultaneously irradiated with illumination in a first wavelength band 1101 and illumination in a second wavelength band 1102. The two illuminations have emission wavelength bands with different center wavelengths. It is more desirable that the emission of the two illuminations is performed using for example, a beam splitter while an optical axis and the emission direction are caused to be the same.

The light that has passed through or reflected off the measured object is incident on an optical system 1003 as the incident light. The optical system 1003 causes light in first and second wavelength bands 1103 to be incident on incident regions 1005 without separating the wavelength bands of the incident light in terms of space. That the light in the first and second wavelength bands can be incident on any incident region and any pixel of the incident regions 1005 is similar to the second embodiment.

Interference light 107 is incident on first pixels 1006 and transmitted light 108 is incident on second pixels 1007. Since the interference light 107 and the transmitted light 108 are generated from the lights in both the first and second wavelength bands, superposition of the lights in two wavelength bands occurs.

Although in this state, independently acquiring optical intensity signals based on phase differences of the first and second wavelength bands is impossible, instead, signals from pixels include a component that corresponds to a case where a phase difference of lights incident on a pair of incident regions adjacent to each other is observed with an equivalent wavelength. A fifth computation unit 1104 extracts the component that corresponds to the case where the observation is performed with the equivalent wavelength and calculates equivalent phase difference information 119. The fifth computation unit 1104 is an example of the computation circuitry.

Since such a configuration needs no switching of illuminations in time division, a photodetection device that is still simpler in configuration can be achieved.

First Example

A first example of the present disclosure is described below.

In the present example, the first incident regions 104 and the second incident regions 105 are arranged as illustrated in FIG. 4C. That is, in the interference element 106, the first incident regions and the second incident regions are alternately arranged on a column-by-column basis. In other words, the light in the first wavelength band, which has a center wavelength referred to as $\lambda_1$, and the light in the second wavelength band, which has a center wavelength referred to as $\lambda_2$, are alternately incident on the interference element 106 on a column-by-column basis. In each column, the incident regions and the light shielding regions are alternately arranged.

Figure 7A:
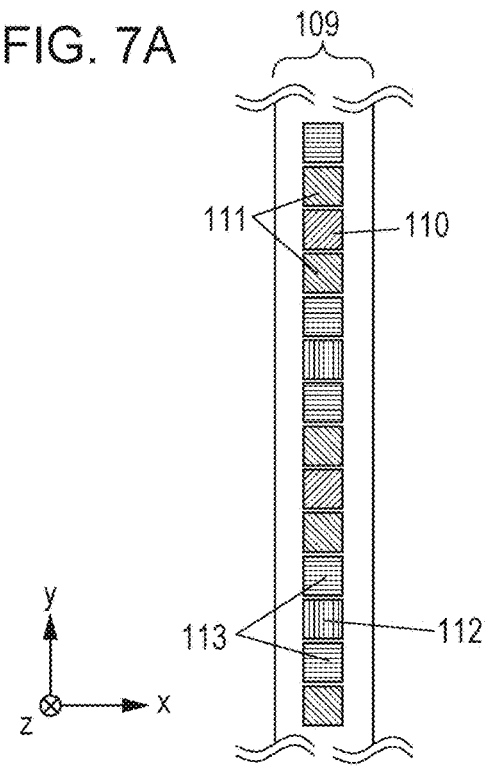
FIG. 7A illustrates an arrangement example of pixels according to the first embodiment of the present disclosure.
Figure 7B:
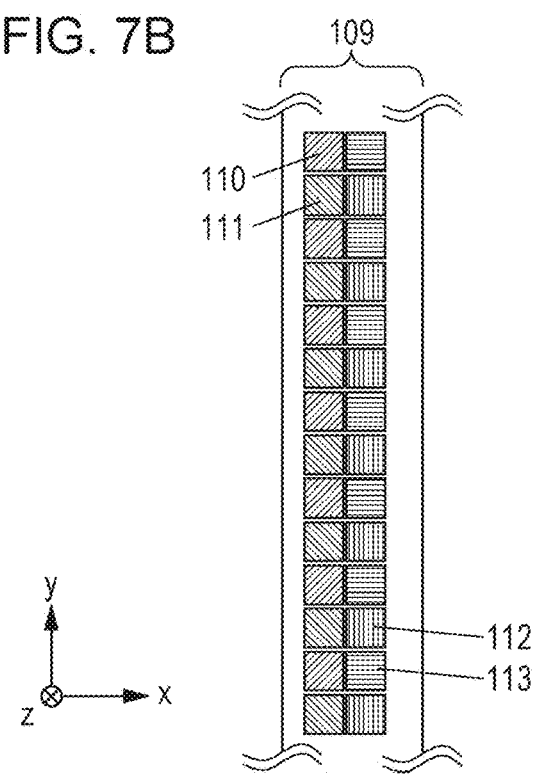
FIG. 7B illustrates an arrangement example of the pixels according to the first embodiment of the present disclosure.
Figure 7C:
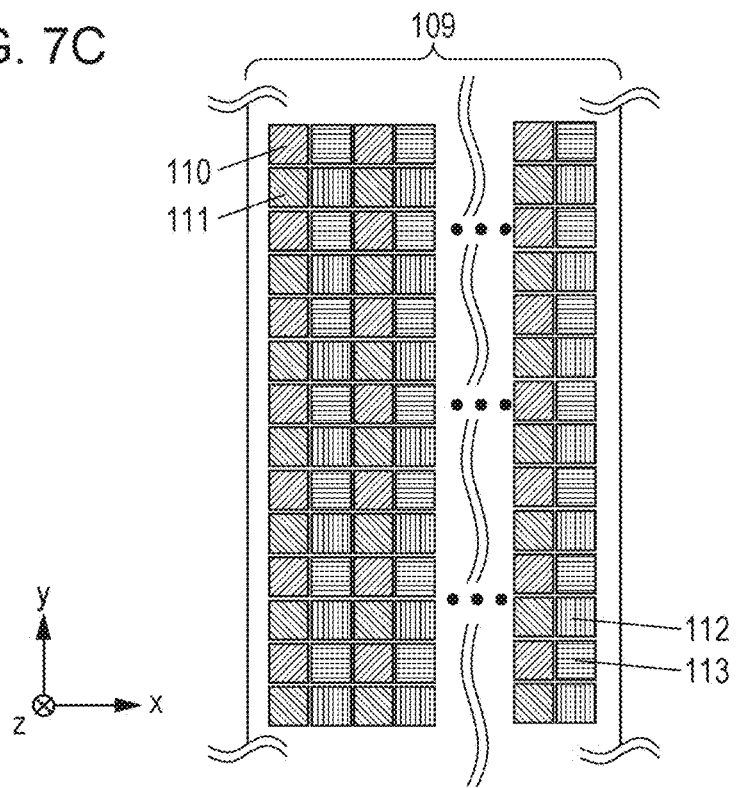
FIG. 7C illustrates an arrangement example of the pixels according to the first embodiment of the present disclosure.
Figure 7D:
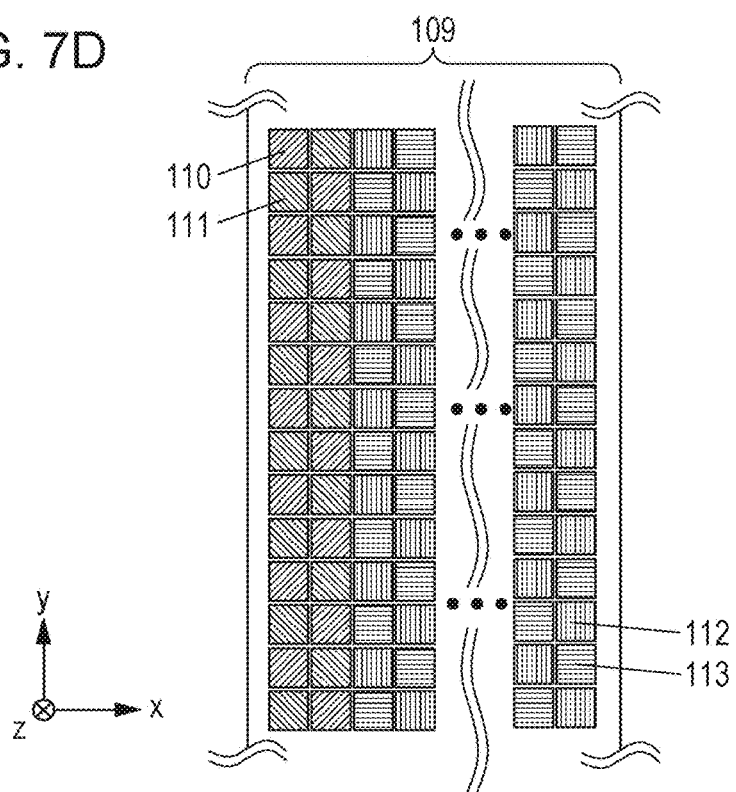
FIG. 7D illustrates an arrangement example of the pixels according to the first embodiment of the present disclosure.
Figure 7E:
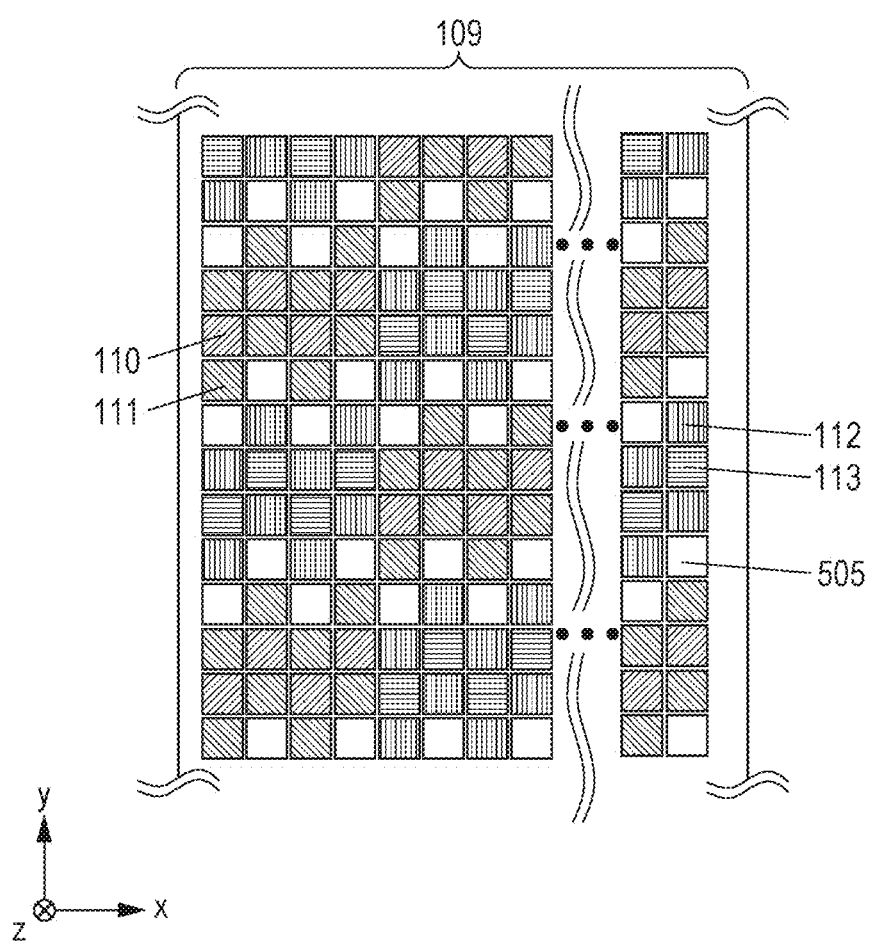
FIG. 7E illustrates an arrangement example of the pixels according to the first embodiment of the present disclosure.

The first pixels 110, the second pixels 111, the third pixels 112, and the fourth pixels 113 are arranged as illustrated in FIG. 7C. As described above, the first and second pixels and the first incident regions, and the third and fourth pixels and the second incident regions are related to each other, respectively. The number of pixels is set to be 100 pixels×100 pixels.

Figure 12:
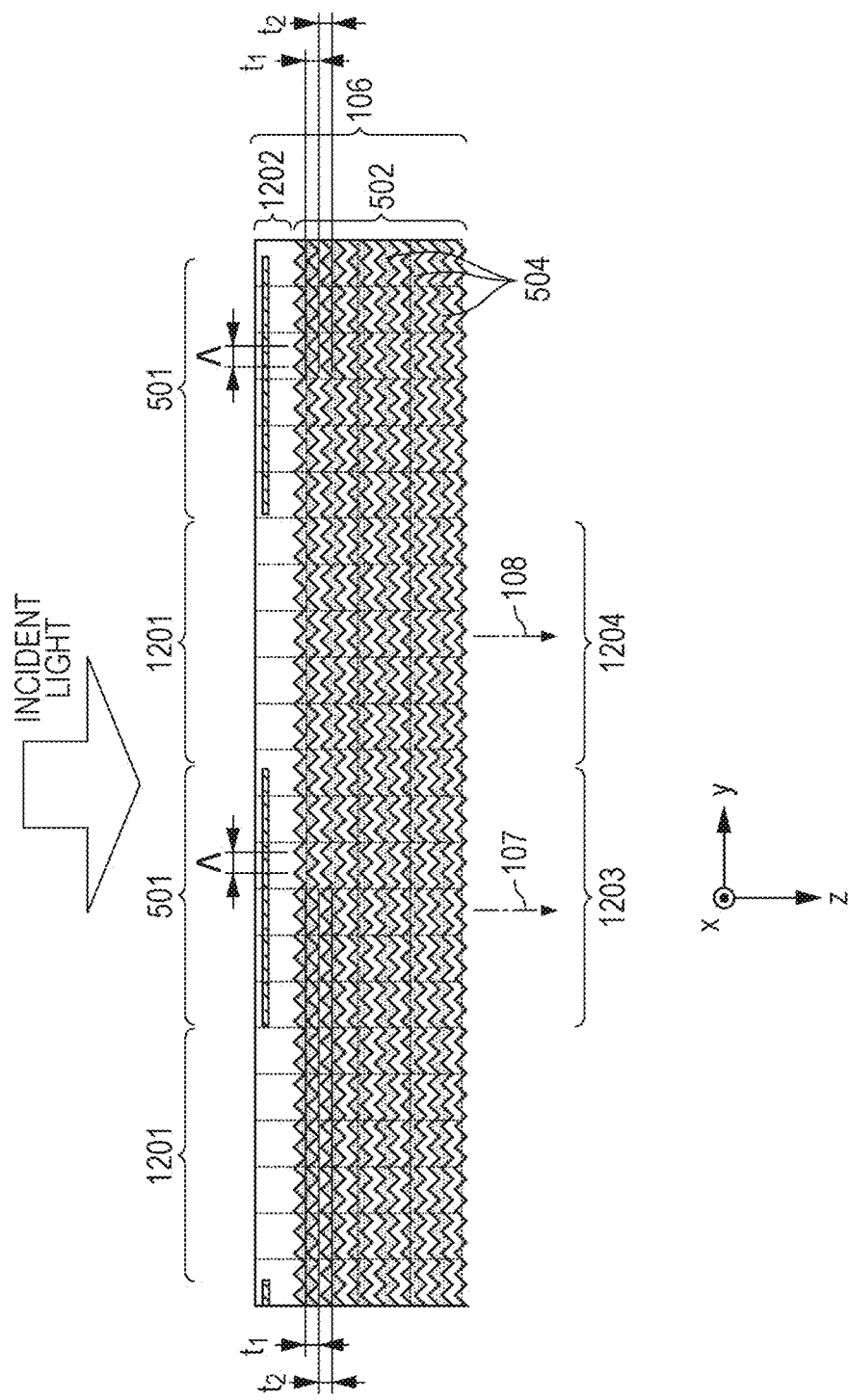
FIG. 12 illustrates a configuration of an interference element according to an example of the present disclosure.

FIG. 12 illustrates a specific cross-sectional configuration of the interference element 106 used in the present example. The interference element 106 includes an optical coupling layer. The incident light irradiates incident regions 1201 and light shielding regions 501. A light shielding layer 1202 is arranged so as to distinguish the incident regions and the light shielding regions from each other. The material of the light shielding layer is Al and the thickness of the light shielding layer is 100 nm. Each of the widths of the incident region and the light shielding regions is 5.6 µm.

An optical coupling layer 502 is made up of six waveguide layers and gratings are formed on vertical interfaces of the waveguide layers. The waveguide layers are each a layer with a relatively high refractive index and in the present example, configured using $Ta_2O_5$. A material for sandwiching the waveguide layers is a transparent layer with a relatively low refractive index and in the present example, is configured using $SiO_2$. The depth of a grating is 0.2 µm and each pitch of the grating, which is indicated as Λ in FIG. 12, is 0.45 µm. The thickness of a $Ta_2O_5$ layer, which is indicated as $t_1$ in FIG. 12, is 0.34 µm, and the thickness of a $SiO_2$ layer between the waveguide layers, which is indicated as $t_2$ in FIG. 12, is 0.22 µm.

When light with a wavelength of 850 nm is caused to be perpendicularly incident on the incident face of the interference element 106 configured as described above, the intensity of the interference light 107 emitted from an interference light region 1203 and the intensity of the transmitted light 108 emitted from a transmitted light region 1204 are calculated by the Finite-difference time-domain method (FDTD). As parameters of the incident light, the intensities of the lights incident on the incident regions 1201 adjacent to each other are equalized and a phase difference is caused to vary from −180 degrees to 180 degrees.

Figure 13:
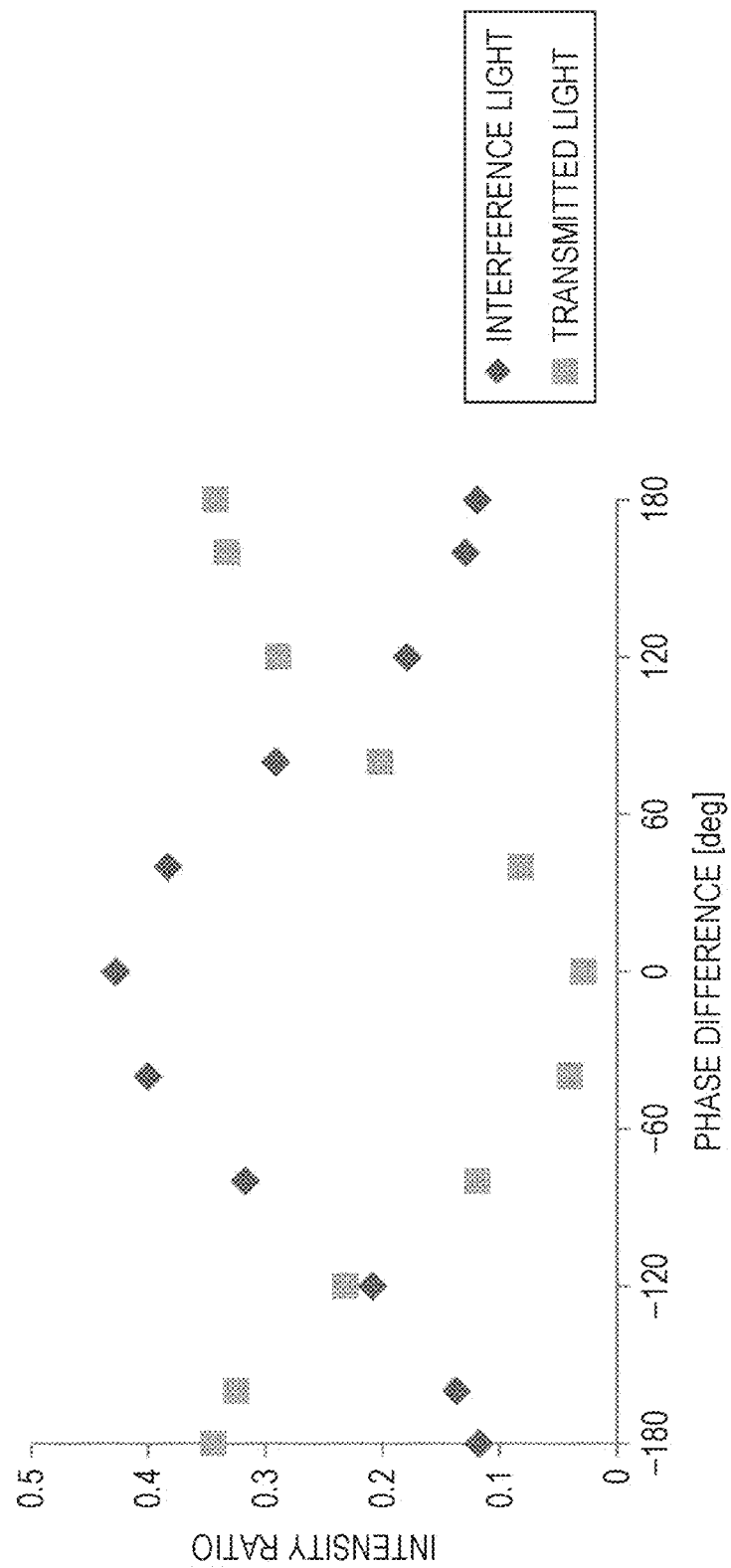
FIG. 13 illustrates the relation between a phase difference of incident light and the intensities of interference light and transmitted light according to an example of the present disclosure.

FIG. 13 illustrates results of calculating the intensities of the interference light 107 and the transmitted light 108 with respect to a phase difference of the incident light, and in FIG. 13, the degrees of a phase difference as a unit is denoted as [deg]. The intensity ratio indicates the ratio to the intensity of the incident light.

When the phase difference is approximately 0 degrees, that is, in phase, the intensity of the interference light is the highest and the intensity of the transmitted light is the lowest. When the phase difference is approximately ±180 degrees, the intensity of the interference light is the lowest and the intensity of the transmitted light is the highest. These results demonstrate that the intensities of the interference light and the transmitted light vary, depending on a phase difference. This indicates that the interference light and the transmitted light are emitted as a result of mutual interference of lights incident from adjacent incident regions in the interference element.

Described next is a procedure of estimating the shape of a measured object using this result on the basis of the light that has passed through the object.

Figure 14A:
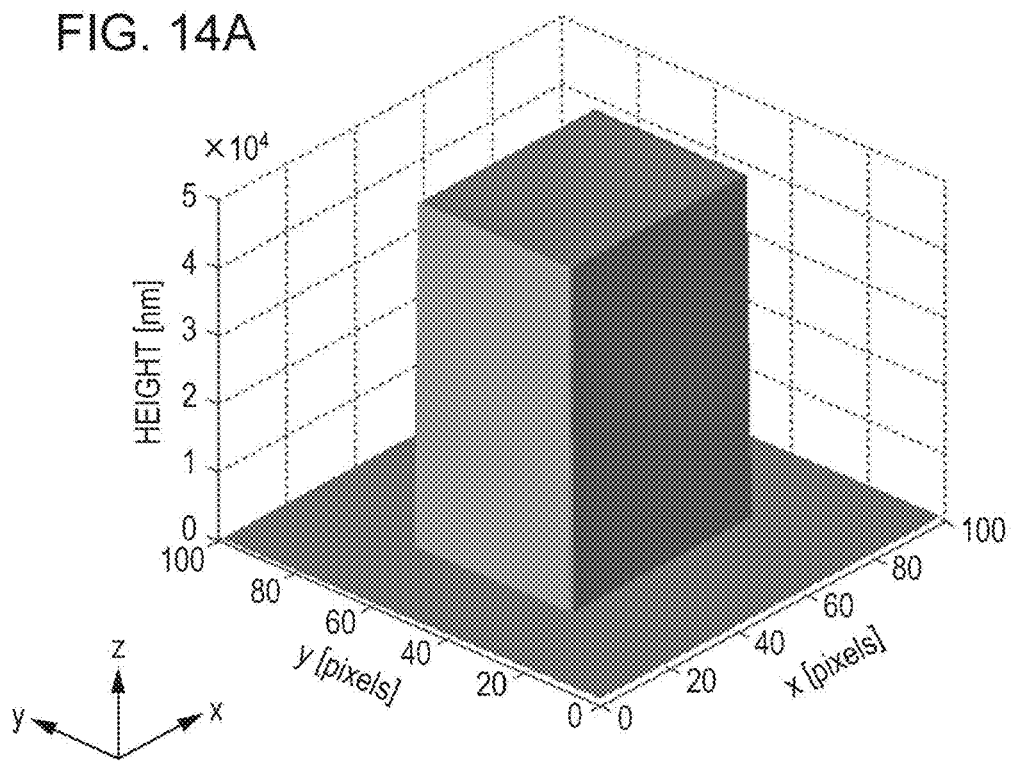
FIG. 14A illustrates the shape of a measured object (sample) according to a first example of the present disclosure.
Figure 14B:
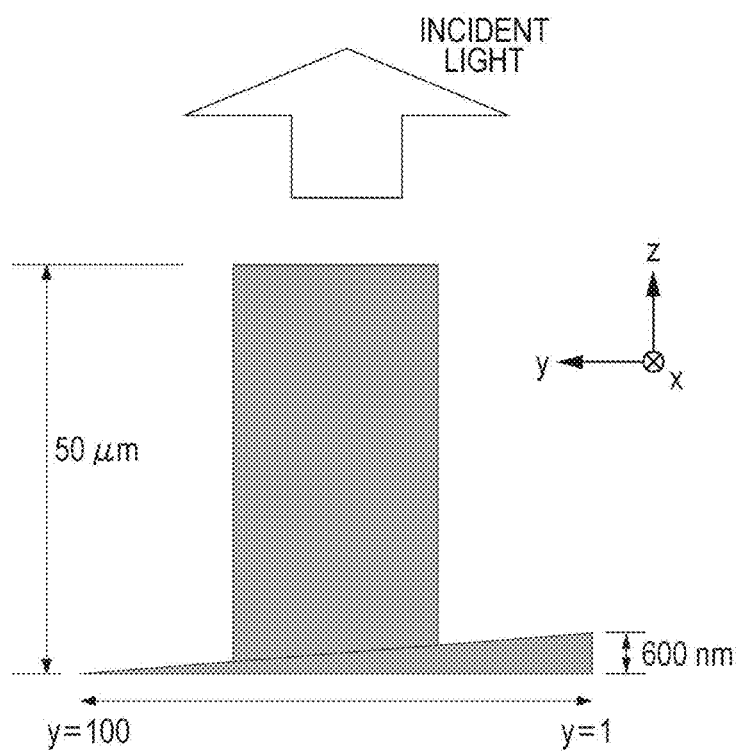
FIG. 14B illustrates the shape of the measured object (sample) according to the first example of the present disclosure.

A sample with the shape illustrated in FIG. 14A is set as the measured object. The sample is constituted of a bottom portion shaped like a narrow wedge and a central projecting portion. FIG. 14B schematically illustrates the shape of the sample viewed in the x direction. The wedge has a thickness of 600 nm and the projecting portion has a height of 50 µm. The refractive index of the sample is 1.45.

In the state where light incident from the bottom face side of the sample passes through the sample and an optical path length difference is caused, the light is assumed to be incident on the optical system as the incident light. It is further assumed that the light that has passed through the region corresponding to the plane in the range where x of the sample=1 to 100 and y of the sample=1 to 100 is incident on the pixels in the range of 100×100 pixels of the image sensor.

The center wavelengths of the lights caused to be incident on the sample are $\lambda_1$=845 nm and $\lambda_2$=855 nm. The bandwidth of each light is 5 nm in full width at half maximum.

Figure 15A:
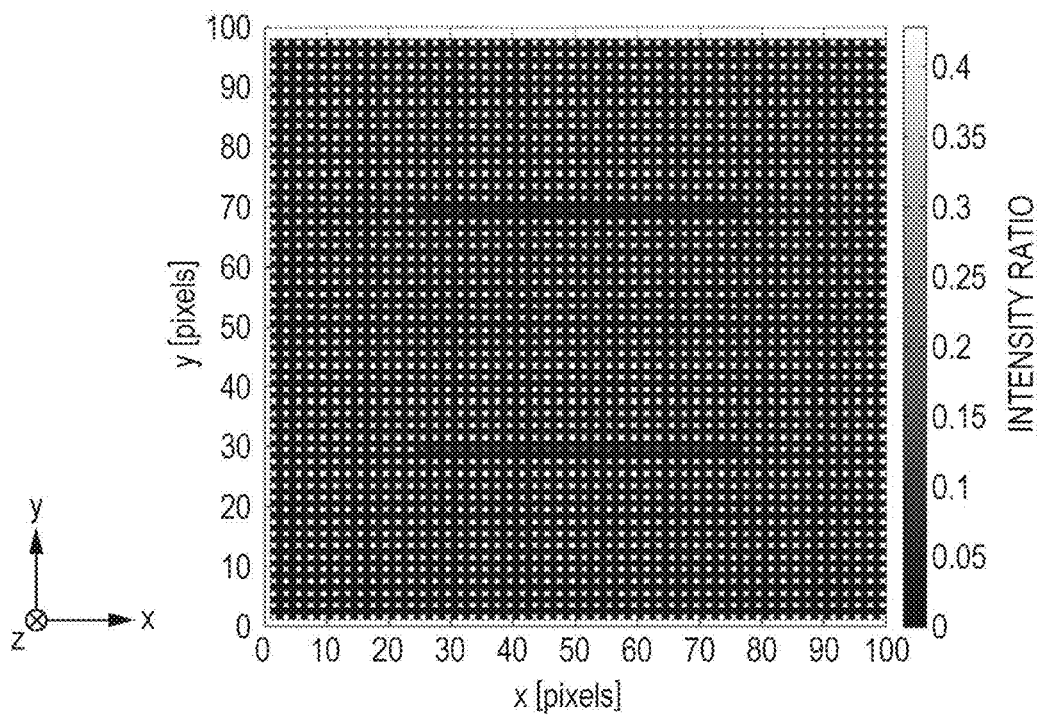
FIG. 15A illustrates the intensity of the light incident on each pixel of first pixels according to the first example of the present disclosure.
Figure 15B:
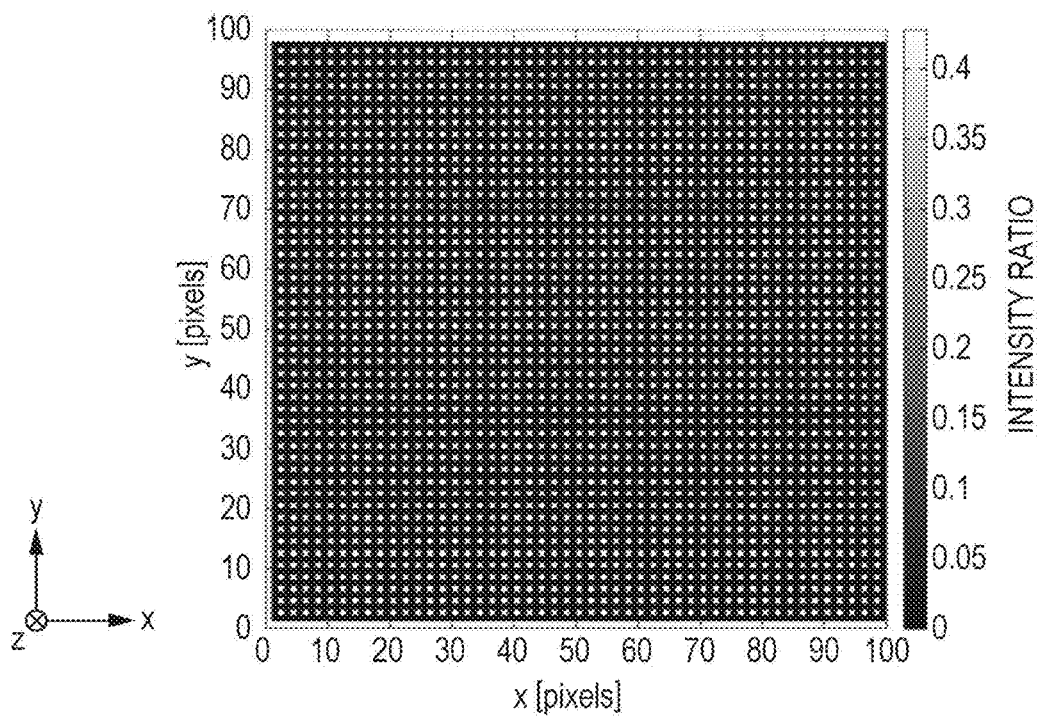
FIG. 15B illustrates the intensity of the light incident on each pixel of second pixels according to the first example of the present disclosure.
Figure 15C:
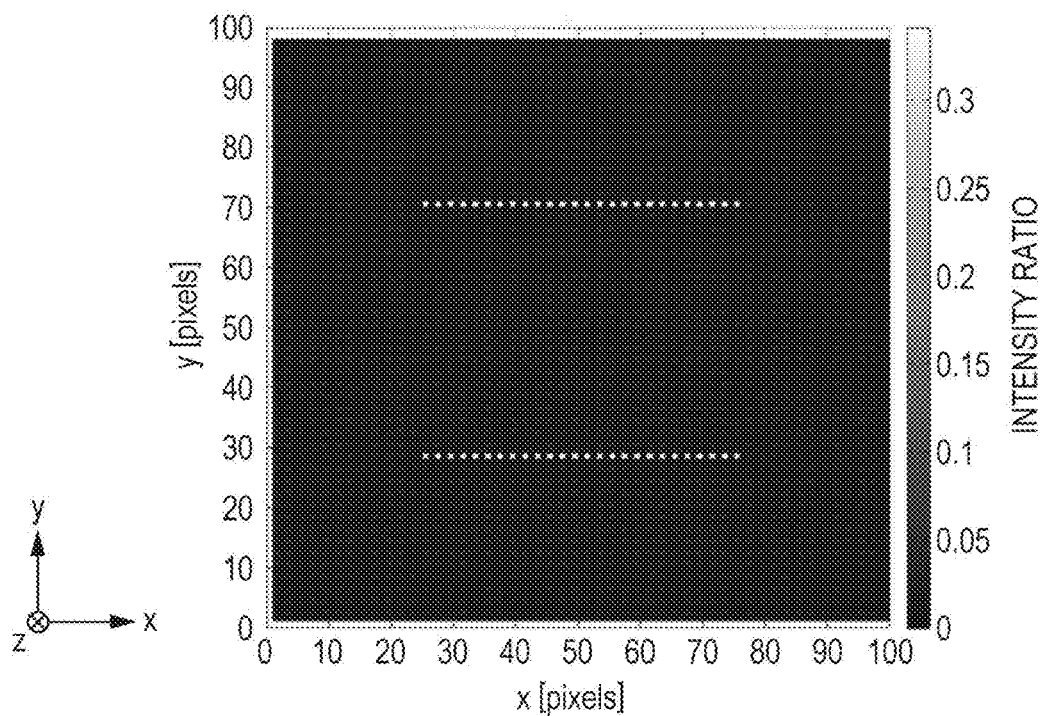
FIG. 15C illustrates the intensity of the light incident on each pixel of third pixels according to the first example of the present disclosure.
Figure 15D:
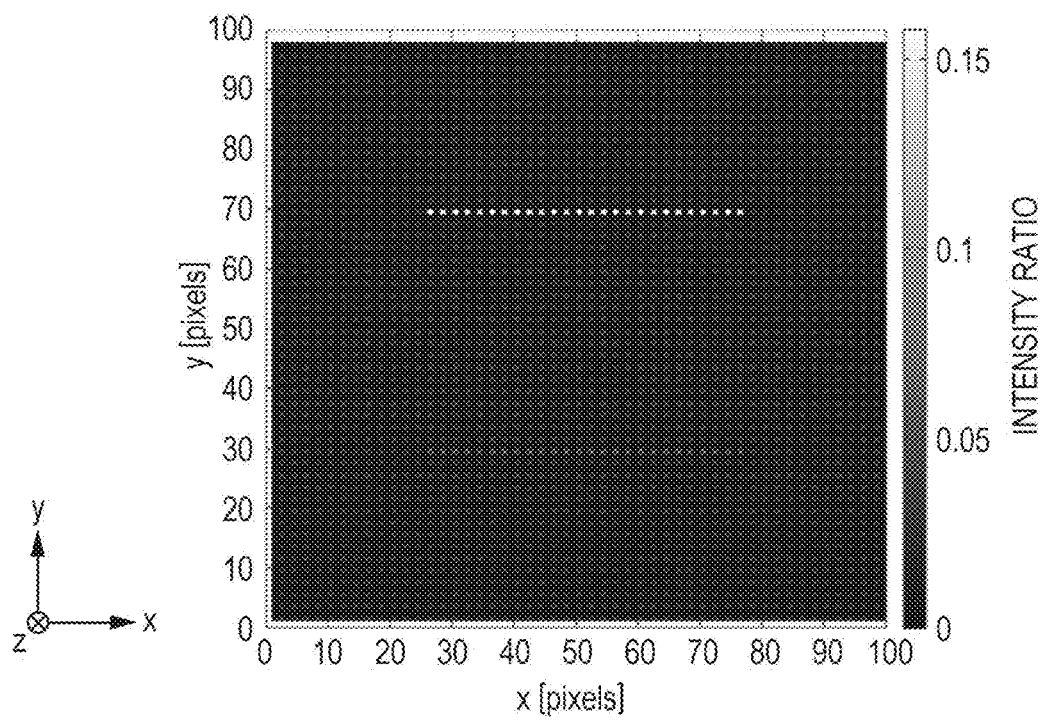
FIG. 15D illustrates the intensity of the light incident on each pixel of fourth pixels according to the first example of the present disclosure.

FIGS. 15A to 15D each illustrate the intensity of the light incident on each pixel of the image sensor. FIG. 15A depicts the interference light with the center wavelength $\lambda_1$, that is, the light incident on first pixels, FIG. 15B depicts the interference light with the center wavelength $\lambda_2$, that is, the light incident on second pixels, FIG. 15C depicts the transmitted light with the center wavelength $\lambda_1$, that is, the light incident on second pixels, and FIG. 15D depicts the transmitted light with the center wavelength $\lambda_2$, that is, the light incident on fourth pixels. In each of FIGS. 15A to 15D, the intensities of the pixels that do not correspond to the illustrated pixels, which are for example the second, third, and fourth pixels in FIG. 15A, are indicated as being zero. Each of FIGS. 15A to 15D demonstrates that, when viewed in the column direction, that is, in the y direction of the drawing, large variations in intensity are caused at locations where an optical path length difference largely varies in adjacent incident regions.

Figure 16A:
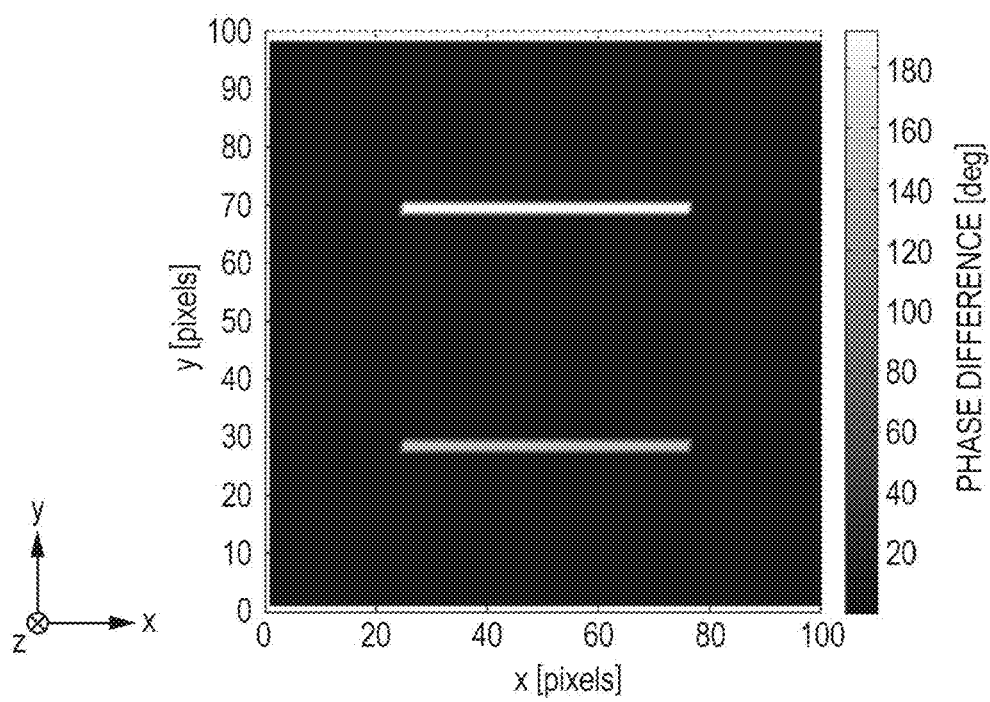
FIG. 16A illustrates distribution of phase difference absolute values at a center wavelength $\lambda_1$ according to the first example of the present disclosure.
Figure 16B:
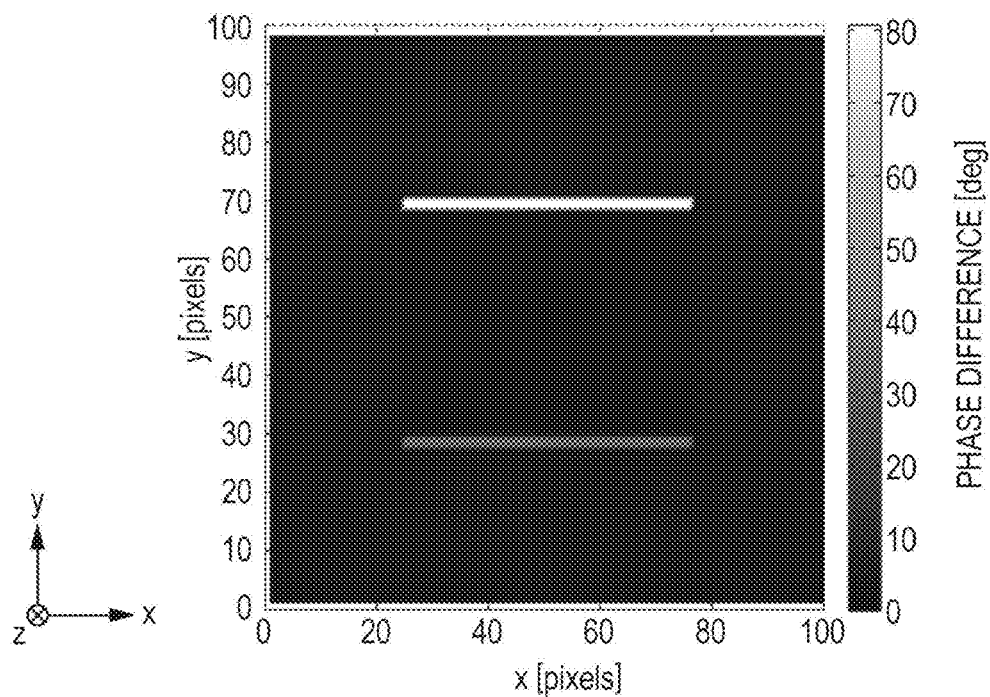
FIG. 16B illustrates distribution of phase difference absolute values at a center wavelength $\lambda_2$ according to the first example of the present disclosure.

In actual measurements, when the relation illustrated in FIG. 13 is used, on the basis of the intensity of the light incident on each pixel of the image sensor, the absolute value of the phase difference at the pixel can be determined. This corresponds to the procedure of determining the phase difference information through the computation in the first computation unit 114 and the second computation unit 115. Since the phase difference value of the center wavelength $\lambda_1$ and the phase difference value of the center wavelength $\lambda_2$ are alternately obtained on a column-by-column basis, regarding a column for which the absolute value of the phase difference with each center wavelength cannot be obtained, the absolute value of the phase difference is determined through for example, interpolation using the absolute values of the phase difference of both nearest neighbor columns. FIGS. 16A and 16B each illustrate the absolute values of the phase difference at the center wavelengths $\lambda_1$ and $\lambda_2$, which are calculated in this manner.

Figure 17A:
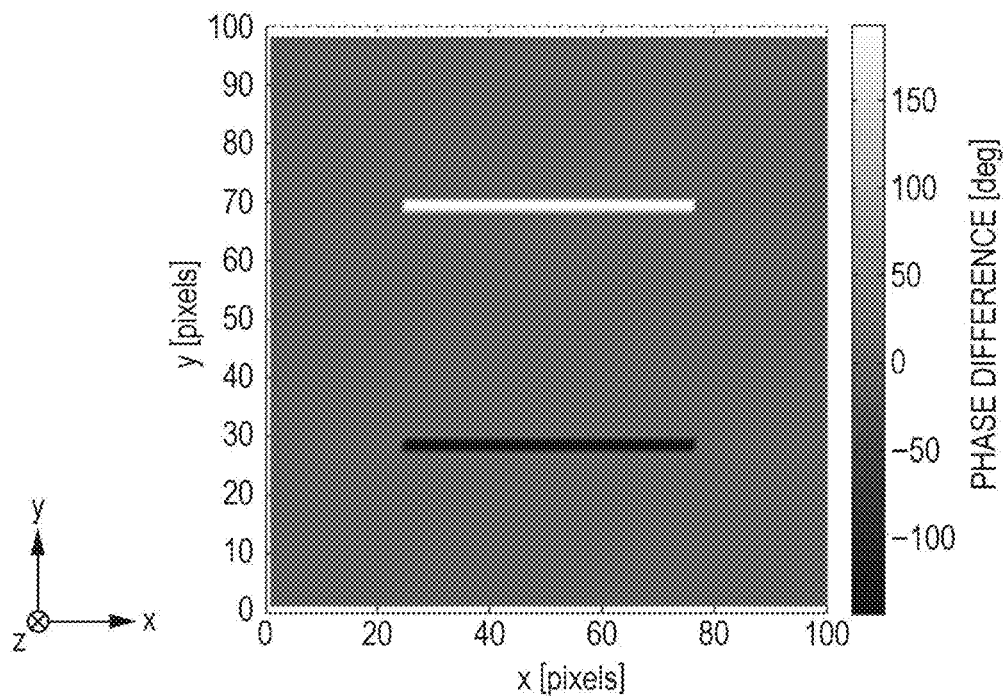
FIG. 17A illustrates distribution of phase difference values at the center wavelength $\lambda_1$ according to the first example of the present disclosure.
Figure 17B:
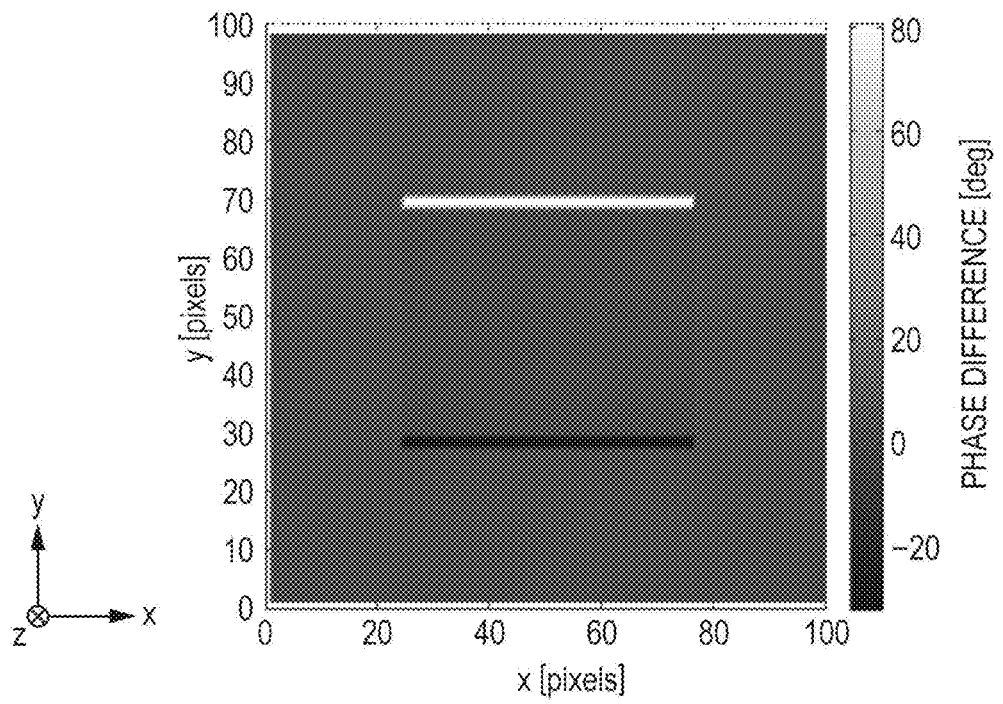
FIG. 17B illustrates distribution of phase difference values at the center wavelength $\lambda_2$ according to the first example of the present disclosure.

To discriminate the polarity of the phase difference, for example, the variations in the absolute value of the phase difference may be observed at the time of inclining the sample while the x direction serves as an axis. This is because the direction in which the absolute value of the phase difference increases or decreases varies, depending on the polarity of the phase difference. FIGS. 17A and 17B each illustrate the values of the phase difference at the center wavelengths $\lambda_1$ and $\lambda_2$, which are determined together with the polarity in this manner.

Figure 18:
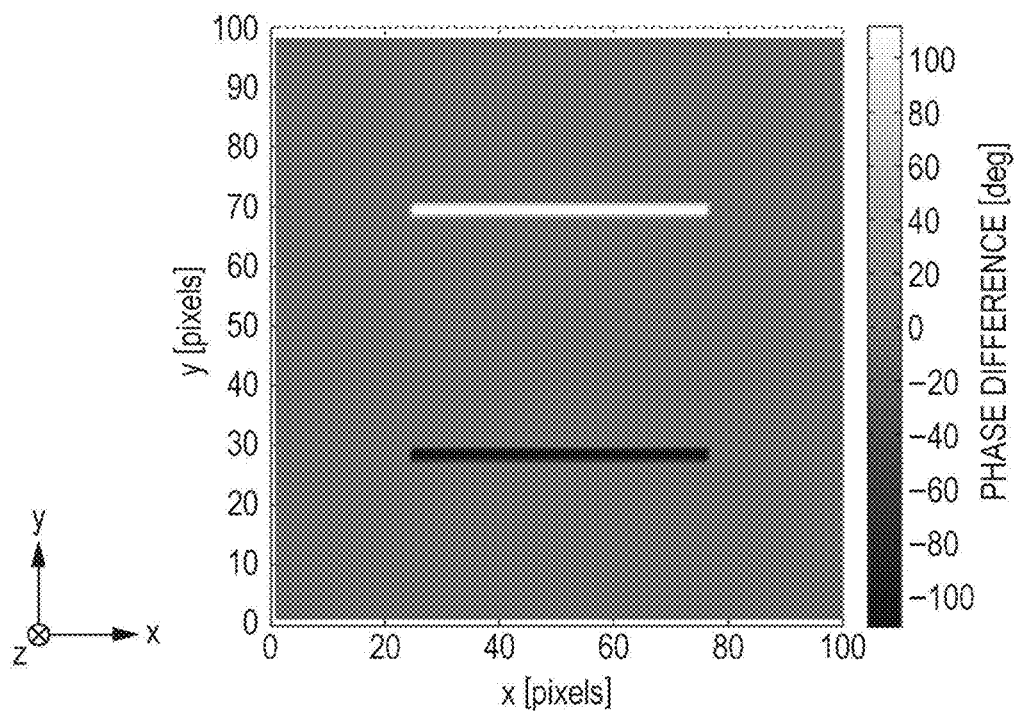
FIG. 18 illustrates distribution of phase difference values at an equivalent wavelength $\lambda_{eff}$ according to the first example of the present disclosure.

Calculating the values of the phase difference of adjacent incident regions at the equivalent wavelength $\lambda_{eff}$ on the basis of the values of the phase difference of the adjacent incident regions at the center wavelengths $\lambda_1$ and $\lambda_2$ is enabled by using the method described in for example, Japanese Unexamined Patent Application Publication No. 10-221032 or Yeou-Yen Cheng and James C. Wyant: "Two-wavelength phase shifting interferometry", Applied Optics, vol. 23, No. 24, pp. 4539 to 4543. This corresponds to the procedure of determining the phase difference information through the computation in the third computation unit 118. FIG. 18 illustrates the phase difference values at the equivalent wavelength $\lambda_{eff}$, which are determined in this manner.

Figure 19:
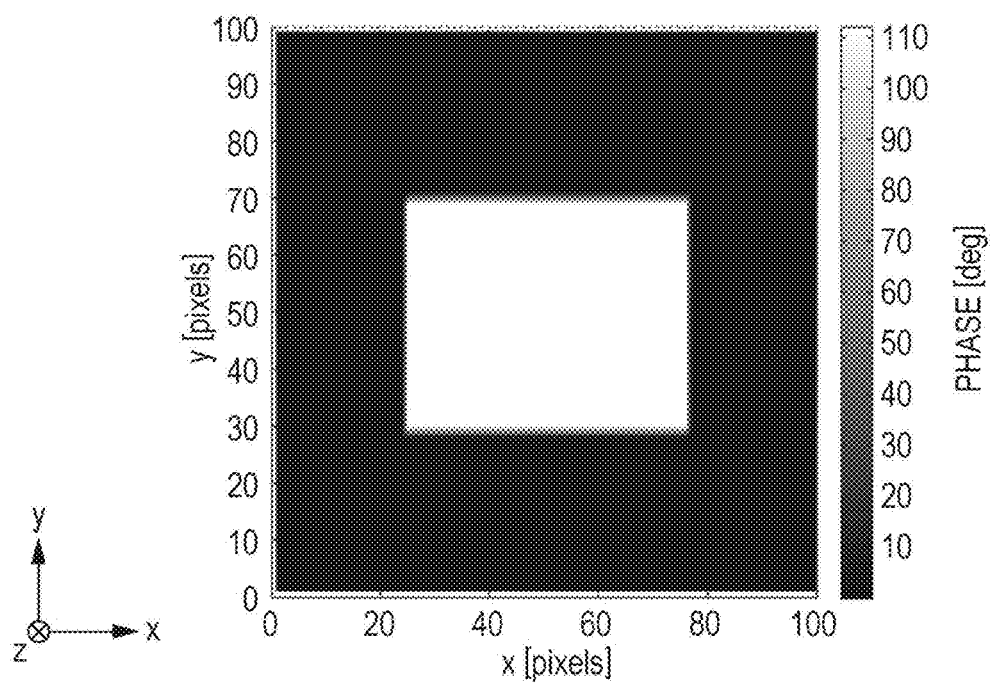
FIG. 19 illustrates distribution of phase values at the equivalent wavelength $\lambda_{eff}$ according to the first example of the present disclosure.

When the phase difference values at $\lambda_{eff}$ are integrated in the column direction, the phase values at $\lambda_{eff}$ can be calculated. FIG. 19 illustrates the calculation results of the phase values at $\lambda_{eff}$.

Figure 20A:
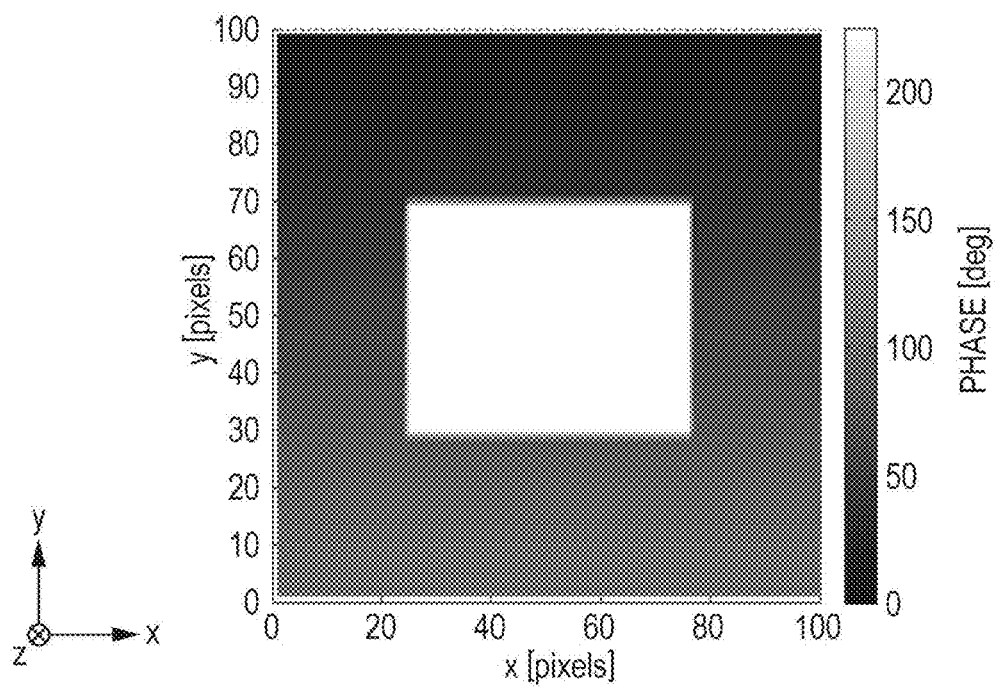
FIG. 20A illustrates distribution of phase values at the center wavelength $\lambda_1$ according to the first example of the present disclosure.
Figure 20B:
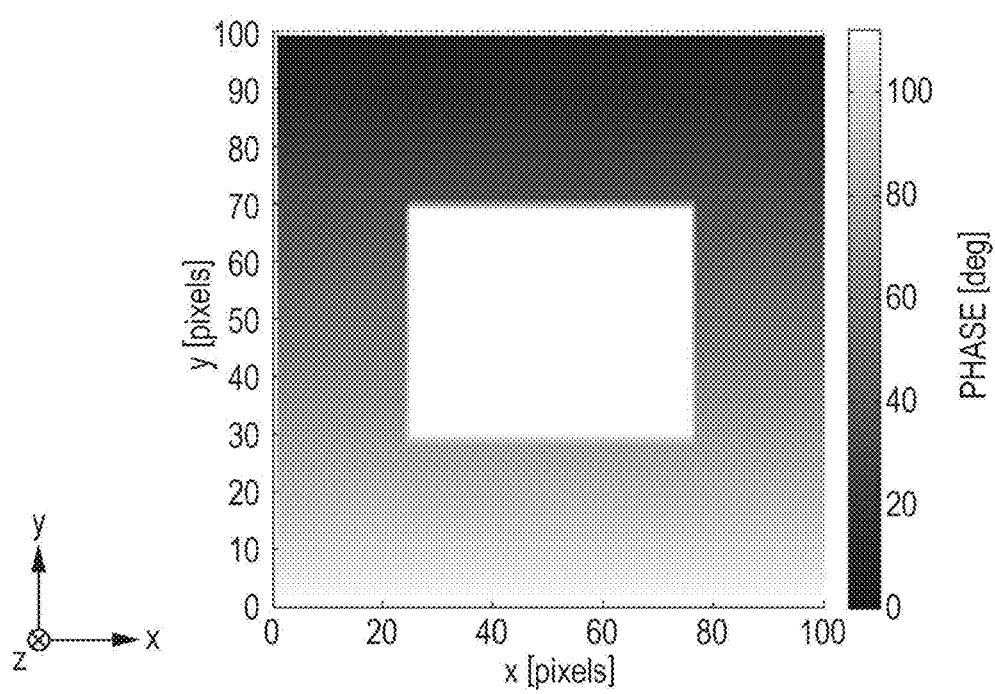
FIG. 20B illustrates distribution of phase values at the center wavelength $\lambda_2$ according to the first example of the present disclosure.

The phase values at $\lambda_1$ and $\lambda_2$ may be determined by integrating the phase difference values at $\lambda_1$ and $\lambda_2$ in the respective column directions and then the phase values at $\lambda_{eff}$ may be determined using the calculation results. FIGS. 20A and 20B each illustrate the phase values at $\lambda_1$ and $\lambda_2$.

Figure 21:
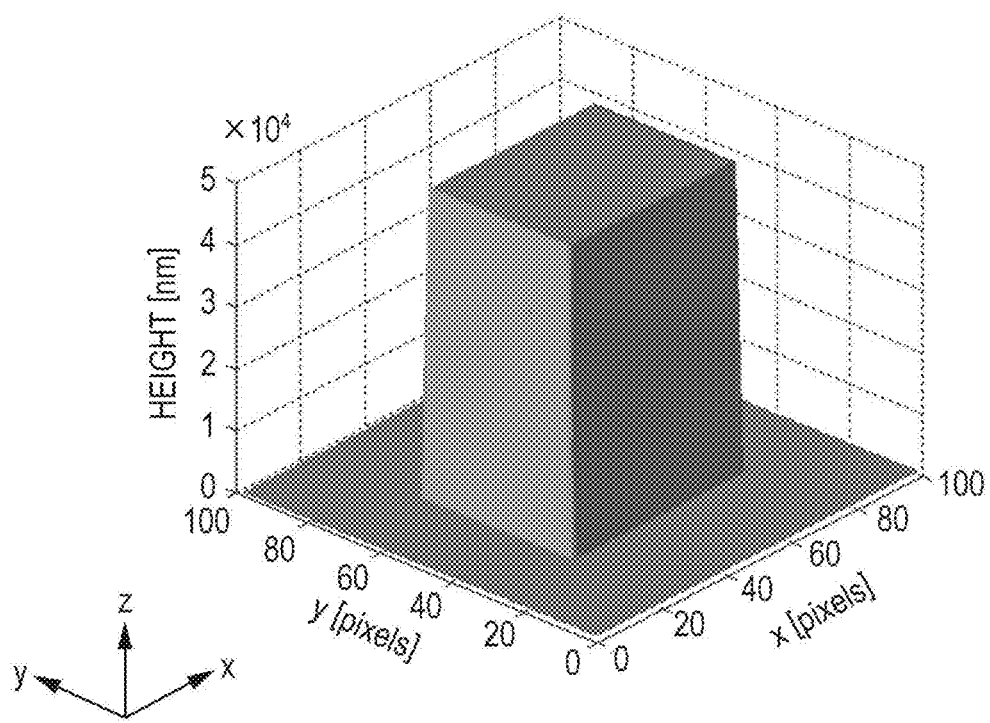
FIG. 21 illustrates a sample shape reconstructed at the equivalent wavelength $\lambda_{eff}$ according to the first example of the present disclosure.

Since the distribution of optical path length differences can be determined on the basis of the phase values at $\lambda_{eff}$, the shape of the sample can be reconstructed and estimated using the refractive index values of the sample. FIG. 21 illustrates the estimated shape. It is demonstrated that the original shape of the sample illustrated in FIG. 14A can be reconstructed almost perfectly.

Figure 22A:
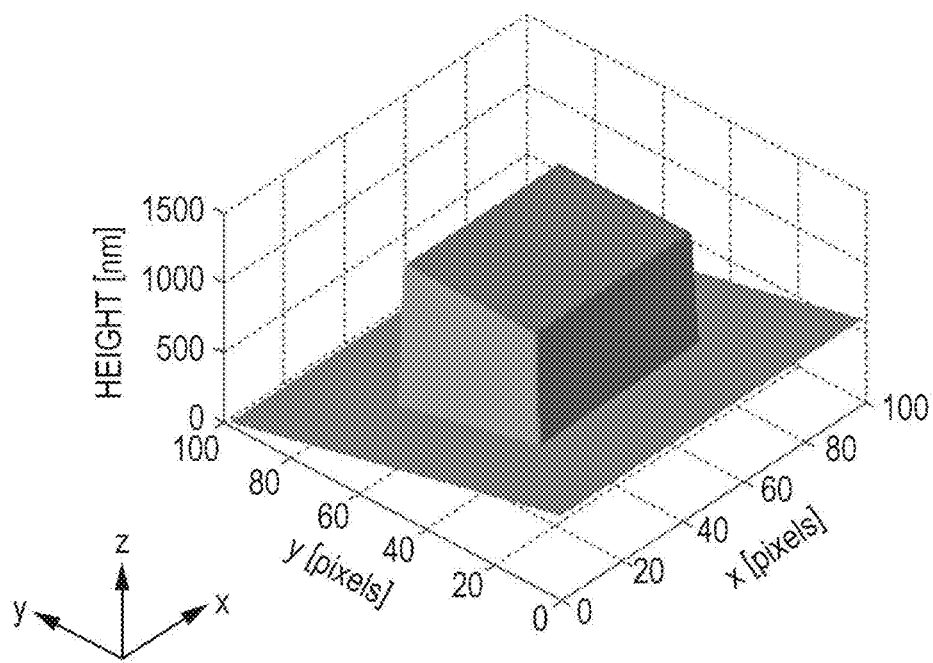
FIG. 22A illustrates a sample shape reconstructed at the center wavelength $\lambda_1$ according to the first example of the present disclosure.
Figure 22B:
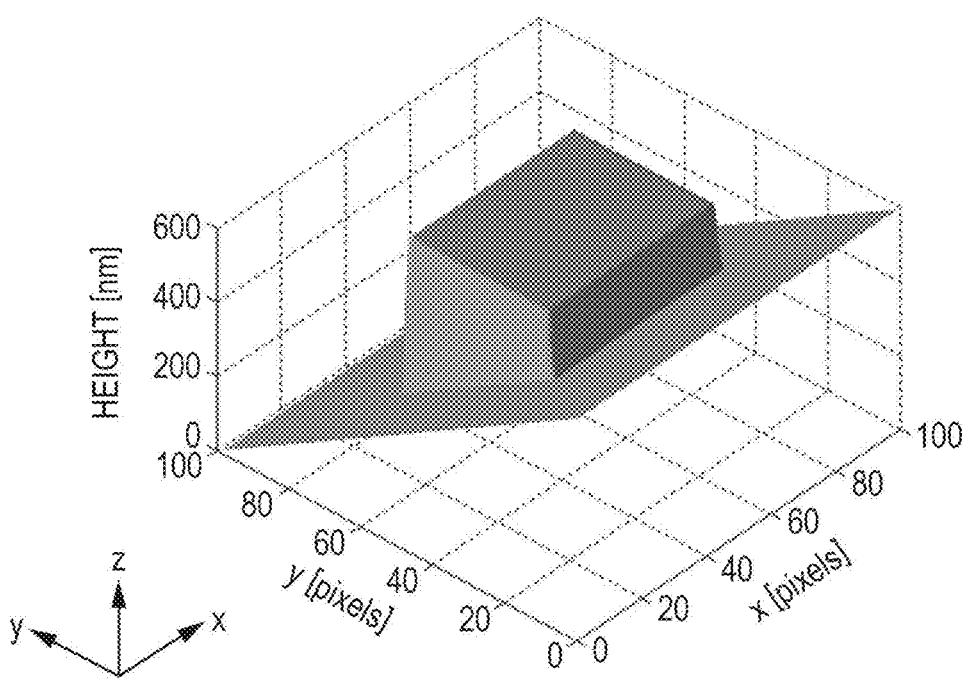
FIG. 22B illustrates a sample shape reconstructed at the center wavelength $\lambda_2$ according to the first example of the present disclosure.

The shape with a step that has a height of approximately 50 µm like the present sample can be correctly reconstructed since the lights with two wavelengths of $\lambda_1$ and $\lambda_2$ are used. The equivalent wavelength $\lambda_{eff}$ according to the present example is expressed as $(855 \times 845)/(855-845)=72.2$ µm and thus, correct reconstruction can be performed when the step complies with an optical path length difference that does not exceed this equivalent wavelength. For comparison, FIGS. 22A and 22B illustrate results of reconstructing the shape only from the light of $\lambda_1$ or $\lambda_2$. It is demonstrated that since the step of the projecting portion of the sample exceeds the wavelength, the shape is not reconstructed precisely.

As described above, the present disclosure provides a photodetection device that has an optical part smaller in size, is less susceptible to the influence of an ambient environment, and can correctly measure the shape of an object even when the object includes a step beyond the wavelength of light.

Second Example

A second example of the present disclosure is described below.

The present example describes a method of measuring a step in a measured object using the photodetection device described in the third embodiment of the present disclosure.

The photodetection device employs the configuration illustrated in FIG. 11. That is, the configuration where lights in the first and second wavelength bands are not separated by the optical system in terms of space. The configuration of the interference element is similar to that in the first example. As for the center wavelengths of the lights caused to be incident on the sample, similar to the first embodiment, $\lambda_1=845$ nm and $\lambda_2=855$ nm.

Figure 23:
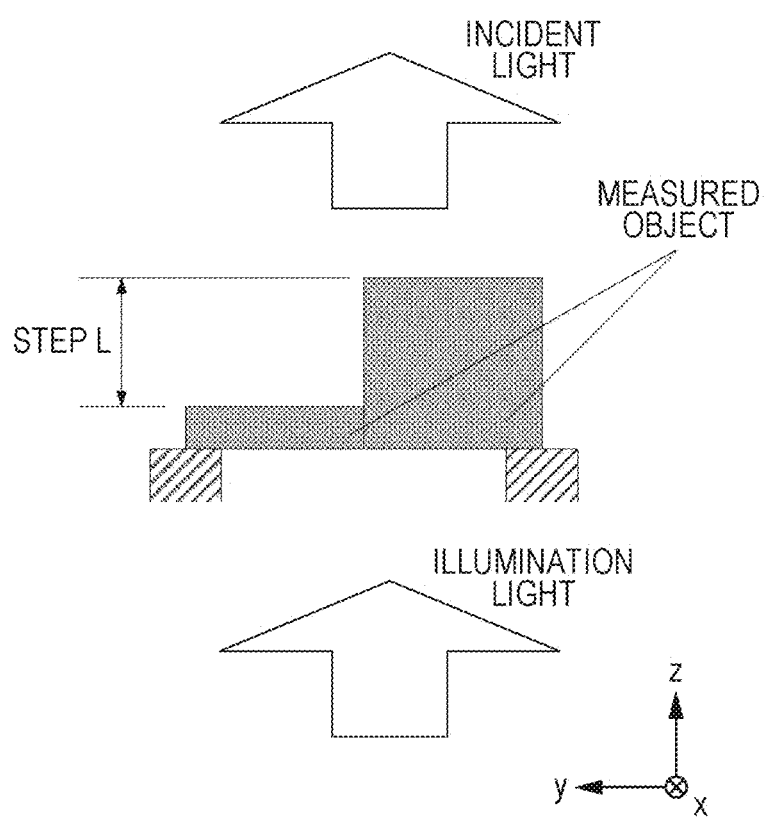
FIG. 23 illustrates the shape of a measured object (samples) according to a second example of the present disclosure.

The samples that are shaped as illustrated in FIG. 23 are assumed as a measured object. The two samples with different heights are caused to be in contact with each other and arranged while a step between the samples is referred to as L. The refractive index of the samples is 1.45.

In the state where light incident from the bottom face side of the samples passes through the samples and an optical path length difference is caused by the step, the light is incident on the optical system as the incident light.

Figure 24A:
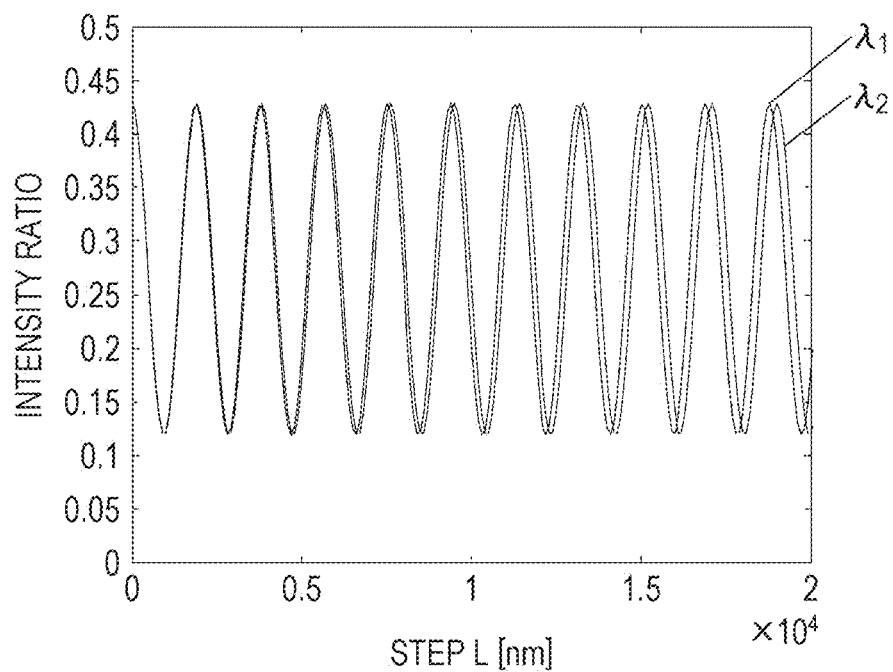
FIG. 24A illustrates the relation between a step of a measured object and the intensities of the interference light and the transmitted light at the center wavelength $\lambda_1$ according to the second example of the present disclosure.
Figure 24B:
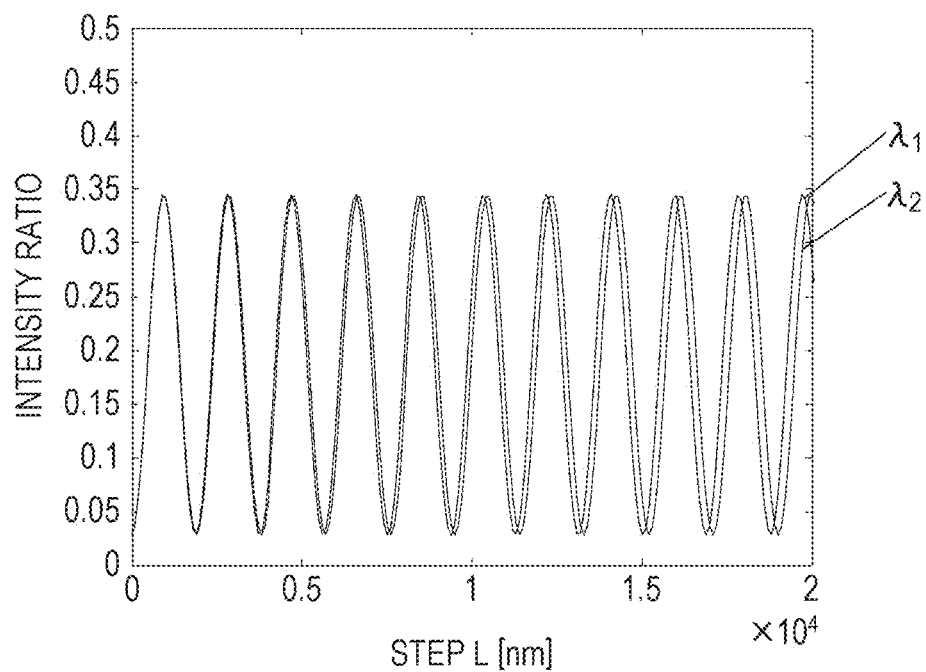
FIG. 24B illustrates the relation between the step of the measured object and the intensities of the interference light and the transmitted light at the center wavelength $\lambda_2$ according to the second example of the present disclosure.

FIGS. 24A and 24B each illustrate the intensities of the interference light and the transmitted light that are obtained when the light incident on a pair of adjacent incident regions has this optical path length difference. The intensity ratio indicates the ratio of the intensity of the interference light or the transmitted light to the incident light. The intensity ratio is plotted while the step L serves as a parameter and the center wavelengths $\lambda_1$ and $\lambda_2$ are separate. Since the wavelengths of $\lambda_1$ and $\lambda_2$ are different from each other, a phase difference deviates even when the step L remains identical. As a result, the intensities of the interference light and the transmitted light deviate between $\lambda_1$ and $\lambda_2$ in intensity, depending on the step L.

Figure 25A:
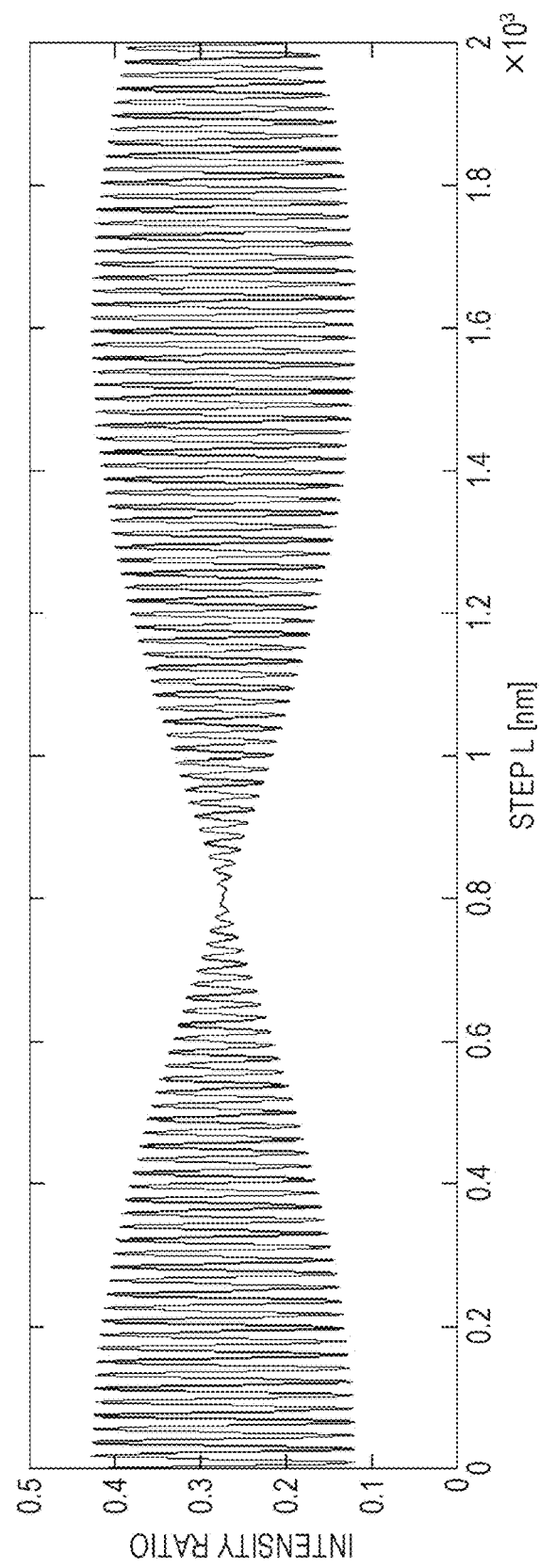
FIG. 25A illustrates the relation between the step of the measured object and the intensity of the interference light at the center wavelength $\lambda_{eff}$ according to the second example of the present disclosure.
Figure 25B:
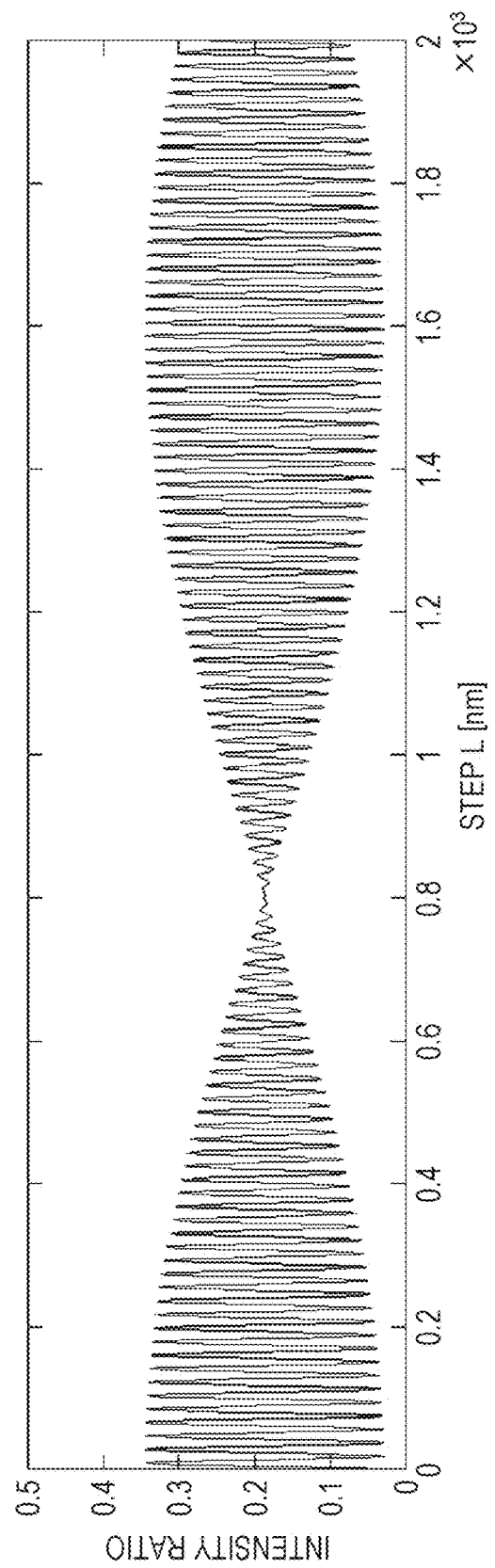
FIG. 25B illustrates the relation between the step of the measured object and the intensity of the transmitted light at the center wavelength $\lambda_{eff}$ according to the second example of the present disclosure.

Since in the configuration of the photodetection device illustrated in FIG. 11, the lights with the center wavelengths $\lambda_1$ and $\lambda_2$ are incident simultaneously on the pixels of the image sensor, an optical intensity signal that can be obtained from the image sensor is a result of the superposition of the lights with $\lambda_1$ and $\lambda_2$. FIGS. 25A and 25B illustrate respective plots of the relations between the intensities of the superposed interference light and the transmitted light and the step L. As demonstrated in FIGS. 25A and 25B, regarding both the interference light and the transmitted light, a component of an envelope varies gently with respect to the step L. This is the component that corresponds to the case where a phase difference is observed at the equivalent wavelength $\lambda_{eff}$.

When this phenomenon is used, for example, a sample is caused to undergo thermal expansion and variations in the step L can be measured. That is, when the intensity of the interference light or the transmitted light is observed while varying the step L and a component of an envelope is extracted as in the procedure that corresponds to the computation in the fifth computation unit, a step beyond the wavelength of the incident light can be correctly measured.

Although in each photodetection device according to the above-described embodiments, the incident light is described as lights in two bands with different center wavelengths, the number of bands may be three or more. The value of a wavelength is not limited to the values mentioned above and may be set so as to be most suitable for a purpose.

The configurations of the photodetection device used in the above-described embodiments and examples are not limited to those described above and can be changed to suitable configurations within a range where the above-described configurations and advantages of the present disclosure are satisfied.

In the present disclosure, all or part of the group consisting of the first computation unit 114, the second computation unit 115, the third computation unit 118, the fourth computation unit 1009, and fifth computation unit 1104 may be implemented as one or more of electronic circuits including, but not limited to, a semiconductor device, a semiconductor integrated circuit (IC) or an LSI. The LSI or IC can be integrated into one chip, or also can be a combination of plural chips. For example, functional blocks other than a memory may be integrated into one chip. The name used here is LSI or IC, but it may also be called system LSI, VLSI (very large scale integration), or ULSI (ultra large scale integration) depending on the degree of integration. A Field Programmable Gate Array (FPGA) that can be programmed after manufacturing an LSI or a reconfigurable logic device that allows reconfiguration of the connection or setup of circuit cells inside the LSI can be used for the same purpose.

Further, it is also possible that all or part of the group is implemented by executing software. In such a case, the software is recorded on one or more non-transitory recording media such as a ROM, an optical disk or a hard disk drive, and when the software is executed by a processor, the software causes the processor together with peripheral devices to execute the functions specified in the software. A system or apparatus may include such one or more non-transitory recording media on which the software is recorded and a processor together with necessary hardware devices such as an interface.

The photodetection device according to the present disclosure is applicable to measurements for industrial, medical, cosmetic, security, and on-vehicle purposes or the like. Further, the photodetection device according to the present disclosure enables new imaging functions such as phase difference distribution or phase distribution to be added to for example, digital still cameras or video cameras.

What is claimed is:

1. A photodetection device, comprising:
   an image sensor that includes first pixels and second pixels;
   an interference element that includes incident regions; and
   illumination that emits light in a first wavelength band and light in a second wavelength band different from the first wavelength band, wherein
   the interference element:
      causes first interference of part of the light in the first wavelength band incident on two incident regions that are included in the incident regions and that are adjacent to each other, and guides resultant light of the first interference to any of the first pixels and guides another part of the light in the first wavelength band incident on the two incident regions to any of the second pixels, and
      causes second interference of part of the light in the second wavelength band incident on the two incident regions, and guides resultant light of the second interference to any of the first pixels and guides another part of the light in the second wavelength band incident on the two incident regions to any of the second pixels.

2. The photodetection device according to claim 1, wherein the illumination emits the light in the first wavelength band and the light in the second wavelength band simultaneously.

3. The photodetection device according to claim 1, wherein the illumination emits the light in the first wavelength band and the light in the second wavelength band in time division.

* * * * *